(12) United States Patent
Fujii et al.

(10) Patent No.: US 8,999,808 B2
(45) Date of Patent: Apr. 7, 2015

(54) NONVOLATILE MEMORY ELEMENT AND METHOD FOR MANUFACTURING THE SAME

(71) Applicant: Panasonic Corporation, Osaka (JP)

(72) Inventors: Satoru Fujii, Osaka (JP); Takumi Mikawa, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/082,237

(22) Filed: Nov. 18, 2013

(65) Prior Publication Data

US 2014/0138599 A1    May 22, 2014

(30) Foreign Application Priority Data

Nov. 21, 2012    (JP) ................................. 2012-255518

(51) Int. Cl.
     *H01L 21/20*      (2006.01)
     *H01L 45/00*      (2006.01)
     *H01L 27/24*      (2006.01)

(52) U.S. Cl.
     CPC .............. *H01L 45/146* (2013.01); *H01L 45/08* (2013.01); *H01L 45/1233* (2013.01); *H01L 45/1625* (2013.01); *H01L 27/2409* (2013.01); *H01L 27/2418* (2013.01); *H01L 27/2463* (2013.01)

(58) Field of Classification Search
     CPC .......... H01L 47/00; H01L 45/00; H01L 21/20
     USPC .......... 438/382, 385, 103, 104; 257/2, 4, 536, 257/537; 365/163, 164
     See application file for complete search history.

(56) References Cited

U.S. PATENT DOCUMENTS

| | | | |
|---|---|---|---|
| 8,022,502 B2 | 9/2011 | Kanzawa et al. | |
| 8,437,173 B2 * | 5/2013 | Hayakawa et al. | 365/148 |
| 8,445,319 B2 | 5/2013 | Kanzawa et al. | |
| 8,618,526 B2 * | 12/2013 | Sorada et al. | 257/4 |
| 8,664,632 B2 * | 3/2014 | Matsushita et al. | 257/4 |
| 8,787,067 B2 * | 7/2014 | Saitoh et al. | 365/148 |
| 2009/0218565 A1 * | 9/2009 | Kawano et al. | 257/43 |

(Continued)

FOREIGN PATENT DOCUMENTS

| | | |
|---|---|---|
| JP | 2009-124167 | 6/2009 |
| JP | 2010-070853 | 4/2010 |

(Continued)

*Primary Examiner* — Caleb Henry
(74) *Attorney, Agent, or Firm* — Wenderoth, Lind & Ponack, L.L.P.

(57) ABSTRACT

A nonvolatile memory element includes a first and a second electrode layers, and a variable resistance layer provided between the first and the second electrode layers and having a resistance value reversibly changing according to application of an electrical pulse, wherein the variable resistance layer includes a first variable resistance layer contacting the first electrode layer and comprising an oxygen-deficient first metal oxide, and a second variable resistance layer contacting the first variable resistance layer and comprising a second metal oxide having a smaller oxygen deficiency than the first metal oxide, and including host layers and an inserted layer between each of adjacent pairs of the host layers, wherein the second metal oxide of the inserted layer has a larger oxygen deficiency than the second metal oxide of the host layer, and the first metal oxide has a larger oxygen deficiency than the second metal oxide of the host layer.

5 Claims, 17 Drawing Sheets

(56) References Cited

U.S. PATENT DOCUMENTS

| | | |
|---|---|---|
| 2009/0224224 A1 | 9/2009 | Fujii et al. |
| 2009/0283736 A1 | 11/2009 | Kanzawa et al. |
| 2010/0090193 A1* | 4/2010 | Mikawa et al. ............... 257/4 |
| 2010/0288995 A1* | 11/2010 | Ozawa et al. .................. 257/4 |
| 2011/0006278 A1* | 1/2011 | Takahashi ....................... 257/4 |
| 2011/0037043 A1* | 2/2011 | Wada ............................... 257/2 |
| 2011/0051500 A1* | 3/2011 | Takagi et al. .............. 365/148 |
| 2011/0233502 A1* | 9/2011 | Shigeoka et al. .............. 257/2 |
| 2011/0233509 A1* | 9/2011 | Shigeoka et al. .............. 257/4 |
| 2011/0235394 A1* | 9/2011 | Sasaki et al. .............. 365/148 |
| 2011/0294259 A1 | 12/2011 | Kanzawa et al. |
| 2012/0068148 A1* | 3/2012 | Kawashima et al. ............ 257/4 |
| 2012/0069627 A1* | 3/2012 | Minemura et al. ........ 365/148 |
| 2012/0195100 A1* | 8/2012 | Saitoh et al. .............. 365/148 |
| 2012/0199805 A1* | 8/2012 | Sorada et al. .................. 257/2 |
| 2012/0243294 A1* | 9/2012 | Kaneko et al. ............ 365/148 |
| 2012/0280224 A1* | 11/2012 | Doolittle et al. .............. 257/43 |
| 2012/0292587 A1* | 11/2012 | Matsuo et al. .................. 257/4 |
| 2012/0299063 A1* | 11/2012 | Baba .............................. 257/208 |
| 2012/0306081 A1* | 12/2012 | Ishizaki et al. .............. 257/751 |
| 2012/0326113 A1* | 12/2012 | Yoneda et al. .................. 257/4 |
| 2013/0001504 A1* | 1/2013 | Ninomiya et al. .............. 257/4 |
| 2013/0082230 A1 | 4/2013 | Katayama et al. |
| 2013/0295745 A1 | 11/2013 | Takahashi et al. |
| 2014/0225054 A1* | 8/2014 | Yoneda et al. .................. 257/4 |

FOREIGN PATENT DOCUMENTS

| | | |
|---|---|---|
| WO | 2008/059701 | 5/2008 |
| WO | 2012/042897 | 4/2012 |
| WO | 2012/120893 | 9/2012 |

* cited by examiner

# NONVOLATILE MEMORY ELEMENT AND METHOD FOR MANUFACTURING THE SAME

CROSS REFERENCE TO RELATED APPLICATIONS

The present application is based on and claims priority of Japanese Patent Application No. 2012-255518 filed on Nov. 21, 2012. The entire disclosure of the above-identified application, including the specification, drawings and claims is incorporated herein by reference in its entirety.

FIELD

The present disclosure relates to nonvolatile memory elements using variable resistance layers, and in particular relates to a nonvolatile memory element having stable variable resistance characteristics when the nonvolatile memory element is successively manufactured and a method for manufacturing the nonvolatile memory element with such characteristics.

BACKGROUND

With the progress in the digital technology of electronic devices in recent years, nonvolatile semiconductor memory devices with a large capacity have been actively developed for storing data, such as music, images, and information.

Furthermore, a variable resistance nonvolatile semiconductor memory device (hereinafter referred to as a variable resistance memory) using a variable resistance element in which a resistance value changes according to the application of an electrical pulse and the state is maintained draws attention in that it is easy to ensure consistency with a normal semiconductor manufacturing process.

The variable resistance memory includes two electrodes and a recording layer comprising a metal oxide (variable resistance layer) provided between the electrodes, reversibly changes the recording layer between a high resistance state and a low resistance state by applying an electrical pulse between the electrodes, and is used as a memory by associating different resistance values generated from the change with data "1" and data "0", respectively.

As disclosed in Patent Literature 1, a variable resistance memory using a tantalum oxide thin film with nonstoichiometric composition which shows electrical conductivity in the variable resistance layer have good variable resistance characteristics in that the memory can operate at a fast speed of no more than 100 ns and can rewrite no less than 1000 times.

The tantalum oxide thin film with nonstoichiometric composition, using metal tantalum as a target, is formed by a reactive sputtering method using argon and oxygen gas as a sputtering gas.

Moreover, Patent Literature 2 discloses that by repeating a process of forming a metal oxide film by reactive sputtering using a metal target and a process of further oxidizing the surface of the metal oxide film with thermal processing, a laminate of a plurality of metal oxide films each of which is treated with surface oxidation is formed. Then by treating the laminate with thermal processing in the last stage, a metal oxide layer is formed with an intended resistivity from the laminate.

CITATION LIST

Patent Literature

Patent Literature 1: WO 2008/059701

Patent Literature 2: Japanese Unexamined Patent Application Publication No. 2010-70853

SUMMARY

Technical Problem

However, the conventional variable resistance nonvolatile memory element having a metal oxide layer with nonstoichiometric composition has a problem that it is difficult to sequentially and successively manufacture a plurality of nonvolatile memory elements having stable variable resistance characteristics.

The present disclosure is conceived to solve the problem, and has an object to provide a nonvolatile memory element having stable variable resistance characteristics when successively manufactured and a method for manufacturing the nonvolatile memory element having such characteristics.

Solution to Problem

In order to attain the above described goal, a nonvolatile memory element according to a disclosed aspect comprises: a first electrode layer; a second electrode layer; and a variable resistance layer which is provided between the first electrode layer and the second electrode layer and has a resistance value which reversibly changes according to application of an electrical pulse, wherein the variable resistance layer includes a first variable resistance layer which is in contact with the first electrode layer and comprises an oxygen-deficient first metal oxide, and a second variable resistance layer which is in contact with the first variable resistance layer, comprises a second metal oxide, and includes a plurality of host layers and an inserted layer provided between each of adjacent pairs of the host layers, the second metal oxide having a degree of oxygen deficiency smaller than a degree of oxygen deficiency of the first metal oxide, and a degree of oxygen deficiency of the second metal oxide of the inserted layer is larger than a degree of oxygen deficiency of the second metal oxide of the host layer, and a degree of oxygen deficiency of the first metal oxide is larger than the degree of oxygen deficiency of the second metal oxide of the host layer.

A method for manufacturing a nonvolatile memory element according to a disclosed aspect comprises: forming a first electrode layer above a substrate; forming, above the first electrode layer, a first variable resistance layer comprising an oxygen-deficient first metal oxide; forming, above the first variable resistance layer, a second variable resistance layer which comprises a second metal oxide, and includes a plurality of host layers and an inserted layer provided between each of adjacent pairs of the host layers, the second metal oxide having a degree of oxygen deficiency smaller than a degree of oxygen deficiency of the first metal oxide; and forming a second electrode layer on the second variable resistance layer, wherein in the forming of a second variable resistance layer, the host layer is formed above the first variable resistance layer, the host layer comprising the second metal oxide having a degree of oxygen deficiency smaller than the degree of oxygen deficiency of the first metal oxide, the inserted layer is formed above the host layer, the inserted layer comprising the second metal oxide having a degree of oxygen deficiency larger than a degree of oxygen deficiency of the host layer, and another host layer is formed above the inserted layer, after the host layer and the inserted layer are formed at least once in this order, the another host layer comprising the second metal oxide having a degree of oxygen deficiency smaller than a degree of oxygen deficiency of the inserted layer.

A method for manufacturing a nonvolatile memory element according to a disclosed aspect comprises: forming a second electrode layer above a substrate; forming, above the second electrode layer, a second variable resistance layer which comprises a second metal oxide, and includes a plurality of host layers and an inserted layer provided between each of adjacent pairs of the host layers; forming, above the second variable resistance layer, a first variable resistance layer which comprises a first metal oxide having a degree of oxygen deficiency larger than a degree of oxygen deficiency of the second metal oxide; and forming a first electrode layer above the first variable resistance layer, wherein in the forming of a second variable resistance layer, the host layer is formed above the second electrode layer, the host layer comprising the second metal oxide having a degree of oxygen deficiency smaller than the degree of oxygen deficiency of the first metal oxide, the inserted layer is formed above the host layer, the inserted layer comprising the second metal oxide having a degree of oxygen deficiency larger than a degree of oxygen deficiency of the host layer, and another host layer is formed above the inserted layer, after the host layer and the inserted layer are formed at least once in this order, the another host layer comprising the second metal oxide having a degree of oxygen deficiency smaller than a degree of oxygen deficiency of the inserted layer.

Advantageous Effects

According to a nonvolatile memory element and a method for manufacturing the nonvolatile memory element according to the present disclosure, since the surface of the metal target can be reduced to some extent when the inserted layer is formed, a degree of oxygen deficiency of the host layer can be easily maintained at an intended degree. As a result, when a plurality of nonvolatile memory elements are sequentially and successively manufactured, it is possible to obtain the effect of stabilizing variable resistance characteristics of the nonvolatile memory elements.

BRIEF DESCRIPTION OF DRAWINGS

These and other objects, advantages and features of the invention will become apparent from the following description thereof taken in conjunction with the accompanying drawings that illustrate a specific embodiment of the present invention.

Figure 1:
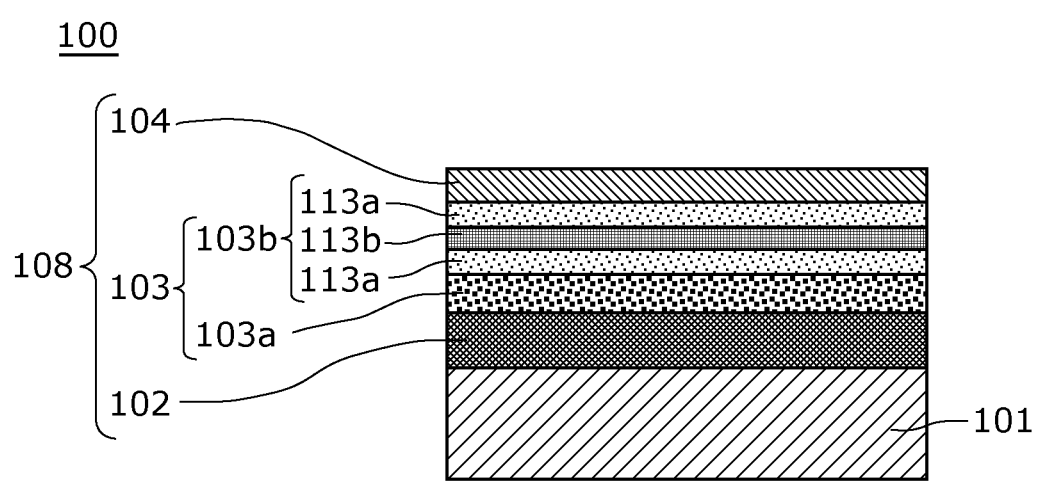
FIG. 1 is a cross-sectional view showing an example of a configuration of a variable resistance nonvolatile memory element according to Embodiment 1.

DESCRIPTION OF EMBODIMENTS (Underlying Knowledge Forming Basis of the Present Disclosure)

The inventors found, regarding the nonvolatile memory element described in the Background column, the following problem with film formation of a transition metal oxide thin film with a nonstoichiometric composition.

In the case where a transition metal oxide thin film with nonstoichiometric composition is formed by a reactive sputtering method which introduces oxygen as a reactive gas using a metal target, the resistivity increases when the oxygen flow rate increases. Especially when an oxide thin film with a high resistivity is formed, a small change in the oxygen flow rate leads to a large change in the resistivity of the formed metal oxide thin film. This trend is not limited to metal films. For example, Patent Literature 2 discloses a relationship between resistivity and oxygen flow rate of the metal oxide thin film formed by the reactive sputtering method which uses tantalum, tungsten, zirconium, hafnium as a target and using argon and oxygen as a sputtering gas ((a) and (b) in FIG. 8, (a) and (b) in FIG. 9 in Patent Literature 2).

As shown in the drawings disclosed in Patent Literature 2, a metal oxide thin film with nonstoichiometric composition of tantalum, tungsten, zirconium and hafnium sees its resistivity increase when oxygen flow rate increases. In the metal oxide thin film of tantalum, tungsten, and zirconium, dependency of the resistivity on the oxygen flow rate is clearly different between a region having resistivity of no more than 10 mΩcm and a region having no less than 10 mΩcm. In the region having resistivity of no less than 10 mΩcm, a slight increase in oxygen flow rate leads to a rapid increase in resistivity. Similarly, in the resistivity of a metal oxide thin film of hafnium having nonstoichiometric composition, dependency on oxygen flow rate increases in a region having resistivity of no less than 12.5 mΩcm.

Therefore, since in a region having great dependency of resistivity with respect to oxygen flow rate, a slight difference in oxygen flow rate leads to a large difference in resistivity, it is difficult to stably form a transition metal oxide thin film having the same resistivity in a normal reactive sputtering method.

Furthermore, when a transition metal oxide thin film having nonstoichiometric composition is successively formed, the surface of a metal target is oxidized by oxygen introduced in the film deposition chamber and the oxidation proceeds according to the film formation process. Furthermore, there is a concern that oxygen gas and film deposition accretion increase on the inside wall of the reaction chamber, and oxygen gas partial pressure increase. As a result, there is a concern that along with the number of substrates provided with a film deposition process, the resistivity of formed oxide thin film continue to increase.

Therefore, the inventors conducted an experiment to confirm dependency of a sheet resistance value on the number of substrates provided with a film deposition process by successively forming a tantalum oxide film having a resistivity of 15 mΩcm (film thickness of 30 nm).

Figure 3:
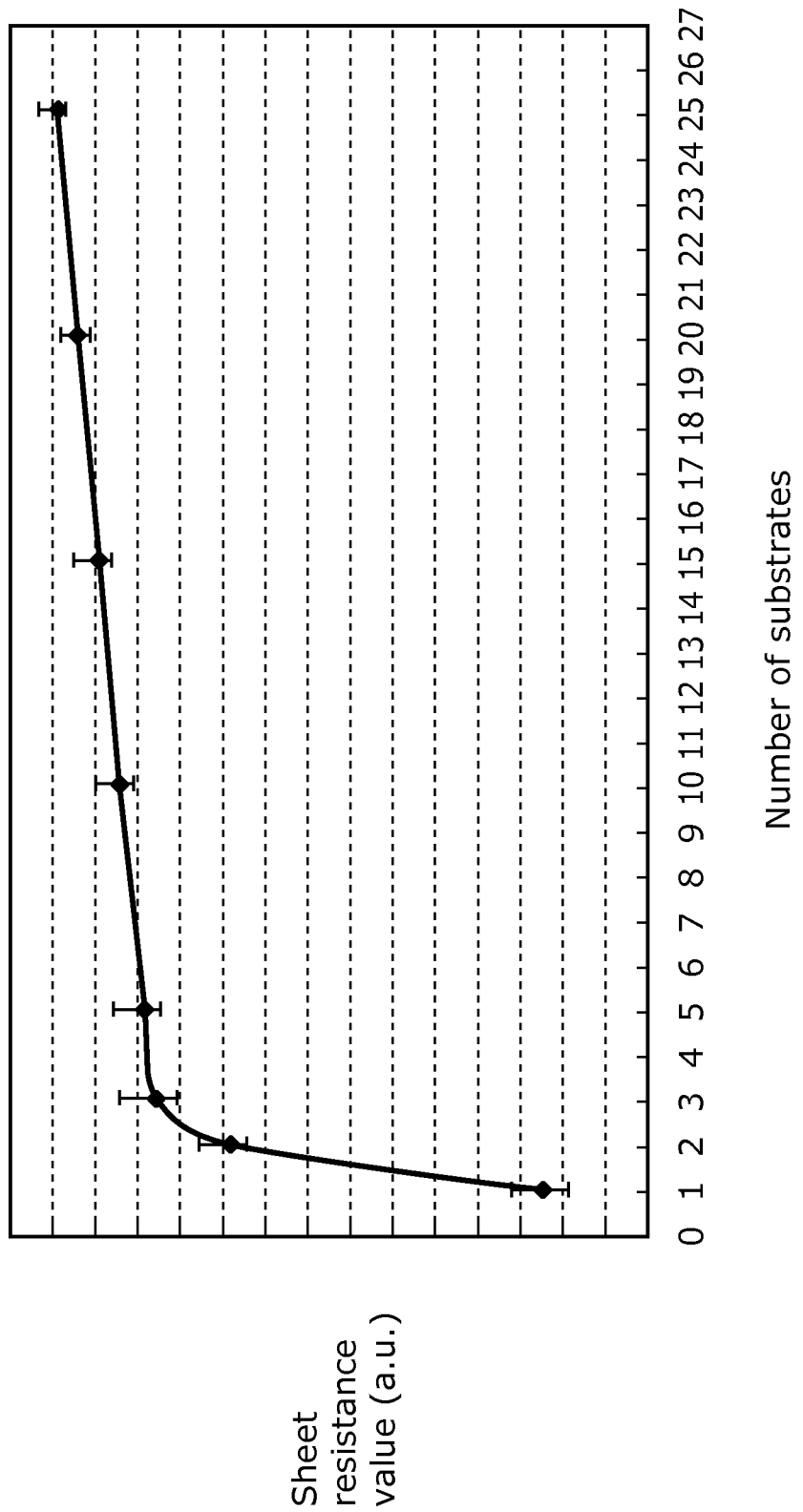
FIG. 3 is a graph showing a relationship between a sheet resistance value of the tantalum oxide thin film according to Embodiment 1 and the number of substrates provided with a film deposition process.

FIG. 3 shows a result. In the process of the first sheet and the second sheet, a sheet resistance value of the tantalum oxide film significantly changes. This is because of the influence of a film deposition environment, shown in FIG. 3, such as absorbed gas in the inside of the film deposition chamber, oxidation state of the target, and the like. In the third and following processed sheets, although a rate of increase in sheet resistance value slows, a sheet resistance value increases by approximately 5% from the third processed sheet to the process of the 25th processed sheet. The formation of a metal oxide thin film having a high resistivity requires film formation under a condition of a high oxygen flow ratio. Therefore, the oxidation of the metal target surface advances according to an increase in the number of processes. As a result, it is considered that a sheet resistance value of the variable resistance layer successively increases.

It should be noted that a reason why a metal oxide having a high resistivity is necessary for a nonvolatile semiconductor memory device is described below. First, it is desirable that in order to drive a device at a low voltage, a resistance value is high for the sufficient application of voltage to a variable resistance element in a circuit. Second, when a resistivity of a transition metal oxide thin film comprised in the variable resistance element is larger, the difference is larger between a resistance value (hereinafter, referred to as Rb) when the variable resistance element is in a high resistance state and a resistance value (hereinafter, referred to as Ra) when the variable resistance element is in a low resistance state. When the difference between Rb and Ra is larger, there is a merit that the margin in determining the written information is larger and an erroneous read of the written information is reduced.

However, as described the above, it is not easy to stably form a transition metal oxide thin film having a high resistivity by a normal reactive sputtering method. Moreover, it is difficult to form a tantalum oxide thin film having nonstoichiometric composition and showing electrical conductivity by a CVD method. This is because when the tantalum oxide thin film is formed by the CVD method, pentaethoxy tantalum that is a material of the tantalum oxide thin film includes oxygen and therefore the tantalum oxide thin film formed by the CVD method becomes an insulator.

In order to attain the above described goal, a nonvolatile memory element according to a disclosed aspect comprises: a first electrode layer; a second electrode layer; and a variable resistance layer which is provided between the first electrode layer and the second electrode layer and has a resistance value which reversibly changes according to application of an electrical pulse, wherein the variable resistance layer includes a first variable resistance layer which is in contact with the first electrode layer and comprises an oxygen-deficient first metal oxide, and a second variable resistance layer which is in contact with the first variable resistance layer, comprises a second metal oxide, and includes a plurality of host layers and an inserted layer provided between each of adjacent pairs of the host layers, the second metal oxide having a degree of oxygen deficiency smaller than a degree of oxygen deficiency of the first metal oxide, and a degree of oxygen deficiency of the second metal oxide of the inserted layer is larger than a degree of oxygen deficiency of the second metal oxide of the host layer, and a degree of oxygen deficiency of the first metal oxide is larger than the degree of oxygen deficiency of the second metal oxide of the host layer. In other words, oxygen content atomic percentage of the inserted layer is smaller than oxygen content atomic percentage of the host layer.

This configuration is obtained by, for example, forming the inserted layer in an atmosphere having oxygen flow rate smaller than when the host layer is formed, in the case where the second variable resistance layer is formed by a reactive sputtering method using a metal target. With this, the surface of the metal target oxidized in the film formation process of the host layer can be reduced to some extent in the film formation process of the inserted layer.

Since at the time of mass production, a plurality of the nonvolatile memory elements are sequentially and successively manufactured, the oxidation gradually proceeds on the surface of the metal target. There is a concern that when the nonvolatile memory element is manufactured later, a degree of oxygen deficiency is smaller for the host layer of the nonvolatile memory element (in other words, the oxygen content atomic percentage is larger) and the resistivity of the host layer increases.

To deal with the concern, according to a nonvolatile memory element and a method for manufacturing the nonvolatile memory element according to a disclosed aspect, by configuring the second resistance layer with the host layer and the inserted layer having oxygen content atomic percentage larger than that of the host layer, the oxygen content atomic percentage of the host layer can be easily maintained at an intended degree for each of the nonvolatile memory elements when the nonvolatile memory element is sequentially and successively manufactured. As a result, it is possible to obtain the effect of stabilizing variable resistance characteristics of the nonvolatile memory elements.

Moreover, each of the first metal oxide and the second metal oxide may be a transition metal oxide or aluminum oxide, and the transition metal oxide may be any one of tantalum oxide, hafnium oxide, and zirconium oxide.

With this configuration, it is possible to stably change the resistance value of the variable resistance layer at a fast speed.

Moreover, a film thickness ratio of the inserted layer to the host layer may be larger than 0 and smaller than 0.09, and a resistivity ratio of the inserted layer to the host layer may be larger than 0 and smaller than 0.18.

With this configuration, when the nonvolatile memory elements are sequentially and successively manufactured, it is possible to obtain the effect of further stabilizing variable resistance characteristics of the nonvolatile memory elements.

Moreover, the variable resistance layer may further include a third variable resistance layer which is in contact with the second variable resistance layer and comprise a third metal oxide having a stoichiometric composition.

With this configuration, since the third metal oxide has stoichiometric composition, there is little change in a degree of oxidation when the nonvolatile memory elements are sequentially and successively manufactured, different from the second metal oxide. Therefore, the third variable resistance layer does not prevent the effect of stabilizing variable resistance characteristics of the nonvolatile memory elements.

Moreover, the nonvolatile memory element may further include a non-ohmic element formed in contact with the second electrode layer, and the non-ohmic element may include a first conductive layer formed in contact with the second electrode layer, a second conductive layer, and a semiconductor layer or an insulating layer which is provided between the first conductive layer and the second conductive layer.

With this configuration, a structure is formed in which the nonvolatile memory element and the non-ohmic element suitable for a cross-point nonvolatile semiconductor memory device are connected in series.

A method for manufacturing a nonvolatile memory element according to a disclosed aspect comprises: forming a first electrode layer above a substrate; forming, above the first electrode layer, a first variable resistance layer comprising an oxygen-deficient first metal oxide; forming, above the first variable resistance layer, a second variable resistance layer which comprises a second metal oxide, and includes a plurality of host layers and an inserted layer provided between each of adjacent pairs of the host layers, the second metal oxide having a degree of oxygen deficiency smaller than a degree of oxygen deficiency of the first metal oxide; and forming a second electrode layer on the second variable resistance layer, wherein in the forming of a second variable resistance layer, the host layer is formed above the first variable resistance layer, the host layer comprising the second metal oxide having a degree of oxygen deficiency smaller than the degree of oxygen deficiency of the first metal oxide, the inserted layer is formed above the host layer, the inserted layer comprising the second metal oxide having a degree of oxygen deficiency larger than a degree of oxygen deficiency of the host layer, and another host layer is formed above the inserted layer, after the host layer and the inserted layer are formed at least once in this order, the another host layer comprising the second metal oxide having a degree of oxygen deficiency smaller than a degree of oxygen deficiency of the inserted layer.

Moreover, the method for manufacturing a nonvolatile memory device may include forming, above the second resistance layer, a third variable resistance layer comprising a third metal oxide having a stoichiometric composition; and forming the second electrode layer above the third variable resistance layer.

A method for manufacturing a nonvolatile memory element according to a disclosed aspect comprises: forming a second electrode layer above a substrate; forming, above the second electrode layer, a second variable resistance layer which comprises a second metal oxide, and includes a plurality of host layers and an inserted layer provided between each of adjacent pairs of the host layers; forming, above the second variable resistance layer, a first variable resistance layer which comprises a first metal oxide having a degree of oxygen deficiency larger than a degree of oxygen deficiency of the second metal oxide; and forming a first electrode layer above the first variable resistance layer, wherein in the forming of a second variable resistance layer, the host layer is formed above the second electrode layer, the host layer comprising the second metal oxide having a degree of oxygen deficiency smaller than the degree of oxygen deficiency of the first metal oxide, the inserted layer is formed above the host layer, the inserted layer comprising the second metal oxide having a degree of oxygen deficiency larger than a degree of oxygen deficiency of the host layer, and another host layer is formed above the inserted layer, after the host layer and the inserted layer are formed at least once in this order, the another host layer comprising the second metal oxide having a degree of oxygen deficiency smaller than a degree of oxygen deficiency of the inserted layer.

Moreover, the method for manufacturing a nonvolatile memory device may include forming, above the second electrode layer, a third variable resistance layer comprising a third metal oxide having a stoichiometric composition; and forming the second variable resistance layer above the third variable resistance layer.

Moreover, in the forming of a host layer, reactive sputtering using a metal target may be performed in an atmosphere having a flow rate of oxygen gas that is a first rate, and in the forming of an inserted layer, reactive sputtering using the metal target may be performed in an atmosphere having a flow rate of oxygen gas that is a second rate smaller than the first rate.

With this manufacturing method, when the nonvolatile memory elements are sequentially and successively manufactured, it is easy to maintain a degree of oxygen deficiency of the host layer at a constant degree for each of the nonvolatile memory elements. As a result, it is possible to obtain the effect of stabilizing variable resistance characteristics of the nonvolatile memory elements.

Moreover, in the forming of a second variable resistance layer, the second variable resistance layer may be formed above the substrate consecutively after a variable resistance layer is formed above a dummy substrate different from the substrate prior to the formation of the second variable resistance layer above the substrate.

With this manufacturing method, it is possible to stabilize a film deposition environment of a substrate of the nonvolatile memory device by forming a film using the dummy substrate.

As described above, by setting, in the second resistance layer, at least one inserted layer having a degree of oxygen deficiency larger than the host layer, the oxidation of the metal target surface and the absorption of oxygen gas on the inside wall of the film formation device are reduced since the oxygen flow rate introduced in the film formation of the inserted layer is smaller than that in the film formation of the host layer. As a result, since the phenomenon can be reduced in which the resistivity of the variable resistance layer successively increases according to the number of processed sheets even when film is successively formed, the present disclosure is useful for reducing fluctuation in characteristics of the nonvolatile semiconductor memory device.

Moreover, the manufacturing method may include forming a non-ohmic element which includes a first conductive layer in contact with the second electrode layer, a second conductive layer, and a semiconductor layer or an insulating layer which is provided between the first conductive layer and the second conductive layer.

With this manufacturing method, it is possible to form a structure in which the nonvolatile memory element and the non-ohmic element and which is suitable for a cross-point nonvolatile semiconductor memory device are connected in series.

The following will describe embodiments with reference to the drawings. The same reference sign is assigned to a component identical to the component having been described above, and a description thereof will be omitted. Moreover, the shapes of a transistor and a storage unit are exemplary, and the number of these is set at the number which is easy to illustrate.

Embodiment 1

FIG. 1 is a cross-sectional view showing an example of a configuration of a variable resistance nonvolatile memory element 100 according to Embodiment 1.

As shown in FIG. 1, the nonvolatile memory element 100 according to Embodiment 1 comprises a substrate 101, and a variable resistance element 108 which includes a first electrode layer 102, a second electrode layer 104, and a variable resistance layer 103. The variable resistance layer 103 is provided between the first electrode layer 102 and the second electrode layer 104, and is a layer having a resistance value which reversibly changes based on an electrical signal provided between the first electrode layer 102 and the second electrode layer 104. For example, the variable resistance layer 103 is a layer which reversibly changes between a high resistance state and a low resistance state according to a polarity of the voltage provided between the first electrode layer 102 and the second electrode layer 104. The variable resistance layer 103 is configured by stacking at least two layers of a first variable resistance layer 103a connected to the first electrode layer 102 and a second variable resistance layer 103b connected to the second electrode layer 104. The second variable resistance layer 103b is configured by at least one inserted layer 113b provided between each of the adjacent pairs of host layers 113a.

The first variable resistance layer 103a comprises an oxygen-deficient first metal oxide, and the second variable layer 103b comprises a second metal oxide having a degree of oxygen deficiency smaller than that of the first metal oxide. The degree of oxygen deficiency of the second metal oxide of the inserted layer 113b is larger than the degree of oxygen deficiency of the second metal oxide of the host layer 113a, and the degree of oxygen deficiency of the first metal oxide is larger than the degree of oxygen deficiency of the second metal oxide of the host layer 113a.

In the second variable resistance layer 103b of the variable resistance element 108, a tiny localized region is formed in which the degree of oxygen deficiency reversibly changes according to the application of an electrical pulse. The localized region is believed to include a filament comprising an oxygen-deficient site.

The term "degree of oxygen deficiency" refers to a proportion of deficient oxygen to an amount of oxygen of an oxide having a stoichiometric composition (a stoichiometric composition having the highest resistance value when stoichiometric compositions are present) in a metal oxide exists. A metal oxide having a stoichiometric composition has a resistance value that is more stable and higher than those of metal oxides having other compositions.

For example, when a metal is tantalum (Ta), an oxide having a stoichiometric composition according to the above definition is $Ta_2O_5$, which can be expressed as $TaO_{2.5}$. A degree of oxygen deficiency of $TaO_{2.5}$ is 0%. A degree of oxygen deficiency of $TaO_{1.5}$ is calculated as a degree of oxygen deficiency=(2.5−1.5)/2.5=40%. Moreover, an oxygen-rich metal oxide has a negative value of a degree of oxygen deficiency. It is to be noted that in the Description, unless otherwise specifically noted, the degree of oxygen deficiency includes a positive value, 0, and a negative value.

An oxide having a low degree of oxygen deficiency has a high resistance value because such an oxide is more similar to an oxide having a stoichiometric composition, and an oxide having a high degree of oxygen deficiency has a low resistance value because such an oxide is more similar to a metal included in an oxide.

The term "oxygen content atomic percentage" refers to the ratio of the number of oxygen atoms to the total number of atoms comprised in a metal oxide. For instance, an oxygen content atomic percentage of $Ta_2O_5$ is calculated according to a ratio of the number of oxygen atoms to the total number of atoms (O/(Ta+O)), that is, 71.4 atm %. Thus, an oxygen-deficient tantalum oxide has an oxygen content atomic percentage from more than 0 to less than 71.4 atm %.

For example, when a metal comprised in the first metal oxide layer and a metal comprised in the second metal oxide layer are the same type, an oxygen content atomic percentage has a correspondence relationship with a degree of oxygen deficiency. In other words, when the second metal oxide has an oxygen content atomic percentage greater than that of the first metal oxide, the second metal oxide has a degree of oxygen deficiency lower than that of the first metal oxide.

A transition metal or aluminum (Al) may be used as the metal comprised in the variable resistance layer 103. Tantalum (Ta), titanium (Ti), hafnium (Hf), zirconium (Zr), niobium (Nb), tungsten (W), nickel (Ni), or the like may be used as the transitional metal. Since the transition metal can take a plurality of oxidation states, this can provide different resistance states by an oxidation-reduction reaction.

For instance, a resistance value of the variable resistance layer 103 can be stably changed at high speed in the case where a tantalum oxide is used so that the first metal oxide comprised in the first variable resistance layer 103a has a composition expressed as $TaO_x$ and the second metal oxide comprised in the second variable resistance layer 103b has a composition expressed as $TaO_y$, where x is between 0.8 and 1.9 inclusive and y is larger than x in value. In this case, the second variable resistance layer 103b may have a film thickness from 1 nm to 8 nm.

For instance, a resistance value of the variable resistance layer 103 can be stably changed at high speed in the case where a hafnium oxide is used so that the first metal oxide comprised in the first variable resistance layer 103a has a composition expressed as $HfO_x$ and the second metal oxide comprised in the second variable resistance layer 103b has a composition expressed as $HfO_y$, where x is between 0.9 and 1.6 inclusive and y is larger than x in value. In this case, the second metal oxide may have a film thickness from 3 nm to 4 nm.

Moreover, a resistance value of the variable resistance layer 103 can be stably changed at high speed in the case where a zirconium oxide is used so that the first metal oxide comprised in the first variable resistance layer 103a has a composition expressed as $ZrO_x$ and the second metal oxide comprised in the second variable resistance layer 103b has a composition expressed as $ZrO_y$, where x is between 0.9 and 1.4 inclusive and y is larger than x in value. In this case, the second metal oxide may have a film thickness from 1 nm to 5 nm.

The first metal comprised in the first metal oxide that is to be the first variable resistance layer 103a and the second metal comprised in the second metal oxide that is to be the second variable resistance layer 103b may be different. In this case, the second metal oxide has a degree of oxygen deficiency lower than that of the first metal oxide, that is, may have a high resistance. With this configuration, a voltage applied between the first electrode layer 102 and the second electrode layer 104 when a resistance change occurs is divided more to the second variable resistance layer 103b, which causes the oxidation-reduction reaction to easily occur in the second variable resistance layer 103b.

Moreover, when the first metal and the second metal are different in material from each other, the second metal may have a standard electrode potential lower than that of the first metal. The standard electrode potential having a larger value represents a property of being more difficult to oxidize. Accordingly, the oxidation-reduction reaction is easy to occur in the second metal oxide having a relatively low standard electrode potential. Here, it is considered that in a resistance change phenomenon, the oxidation-reduction reaction in the tiny localized region formed in the second metal oxide having a high resistance changes the filament (conductive path), thereby changing a resistance value (a degree of oxygen deficiency) of the second metal oxide layer.

For instance, a stable resistance change operation in the variable resistance layer 103 is achieved by using an oxygen-deficient tantalum oxide ($TaO_x$) for the first metal oxide comprised in the first variable resistance layer 103a and a titanium oxide ($TiO_2$) for the second metal oxide comprised in the second variable resistance layer 103b. Titanium (with the standard electrode potential=−1.63 eV) is a material having a standard electrode potential lower than that of tantalum (with the standard electrode potential=−0.6 eV). As above, the oxidation-reduction reaction is more prone to occur in the second variable resistance layer 103b when a metal oxide having a standard electrode potential lower than that of the first metal oxide is used for the second metal oxide. As another combination, an aluminum oxide ($Al_2O_3$) may be used for the second variable resistance layer 103b that is to be a high resistance layer. For example, the oxygen-deficient tantalum oxide ($TaO_x$) may be used for the first variable resistance layer 103a, and the aluminum oxide ($Al_2O_3$) may be used for the second variable resistance layer 103b.

It is considered that in the resistance change phenomenon in the variable resistance layer 103 having a stack structure, regardless of whether the resistance state is changed to a high resistance state or a low resistance state, the oxidation-reduction reaction occurs in the tiny localized region formed in the second variable resistance layer 103b having a high resistance and the filament (conductive path) in the localized region is changed, thereby changing a resistance value of the second variable resistance layer 103b.

To put it another way, when a positive voltage is applied to the second electrode layer 104 connected to the second variable resistance layer 103b with reference to the first electrode layer 102, oxygen ions in the variable resistance layer 103 are attracted toward the second variable resistance layer 103b. With this, oxidation reaction occurs in the tiny localized region formed in the second variable resistance layer 103b, and the degree of oxygen deficiency is reduced. As a result, it is considered that it becomes more difficult to maintain a connection to the filament in the localized region, and the resistance value increases.

In contrast, when a negative voltage is applied to the second electrode layer 104 connected to the second variable resistance layer 103b with reference to the first electrode layer 102, the oxygen ions in the second variable resistance layer 103b are thrust toward the first variable resistance layer 103a. With this, reduction reaction occurs in the tiny localized region formed in the second variable resistance layer 103b, and the degree of oxygen deficiency increases. As a result, it is considered that it becomes easier to get a connection to the filament in the localized region, and the resistance value decreases.

The second electrode layer 104 connected to the second variable resistance layer 103b comprising the second metal oxide having a lower degree of oxygen deficiency comprises a material having a standard electrode potential higher than that comprised in the second metal oxide and that comprised in the first electrode layer 102, such as platinum (Pt), iridium (Ir), palladium (Pd), or the like. The first electrode layer 102 connected to the first variable resistance layer 103a comprising the first metal oxide having a higher degree of oxygen deficiency may comprise a material having a standard electrode potential lower than those of metal comprised in the first metal oxide, such as tungsten (W), nickel (Ni), tantalum (Ta), titanium (Ti), aluminum (Al), tantalum nitride (TaN), titanium nitride (TiN), or the like. The standard electrode potential having a larger value represents a property of being more difficult to oxidize.

In other words, a standard electrode potential V2 of the material comprised in the second electrode layer 104, a standard electrode potential Vr2 of the metal comprised in the second metal oxide, a standard electrode potential Vr1 of the metal comprised in the first metal oxide, and a standard electrode potential V1 of the material comprised in the first electrode layer 102 may satisfy a relationship comprising Vr2<V2 and V1<V2. Furthermore, a relationship of V2>Vr2 and Vr1≥V1 may be satisfied.

With the above described configuration, the oxygen-reduction reaction selectively occurs in the second metal oxide adjacent to the interface between the second electrode layer 104 and the second variable resistance layer 103b, and a stable resistance change phenomenon occurs.

Next, a method for manufacturing a nonvolatile semiconductor memory element according to the present embodiment will be described.

The first electrode layer 102 is formed above the substrate 101 such as silicon wafer. In the present embodiment, tantalum nitride is formed. The tantalum nitride film may be manufactured in a nitride gas atmosphere using Ta target by setting, for example, as a room temperature condition, the chamber pressure to from 0.03 Pa to 3 Pa, the Ar flow rate to 20 sccm, and the $N_2$ flow rate to from 5 sccm to 30 sccm. Moreover, as the first electrode layer 102, a Ti—Al—N alloy may be formed. The Ti—Al—N alloy film may be manufactured in a nitride gas atmosphere using Ti—Al alloy target by setting, for example, as a room temperature condition, the chamber pressure to from 0.03 Pa to 3 Pa, the Ar flow rate to 20 sccm, and the $N_2$ flow rate to from 5 sccm to 30 sccm. The Ti—Al—N alloy film is excellent in flatness of the film and adhesive strength to the substrate. Next, the variable resistance layer 103 is formed above the first electrode layer 102.

The variable resistance layer 103 deposits a $TaO_x$ film by a reactive sputtering method above the first electrode layer 102. The $TaO_x$ film may be manufactured in an oxygen gas atmosphere using Ta target by setting, for example, as a room temperature condition, the chamber pressure to from 0.03 Pa to 3 Pa, the Ar flow rate to 20 sccm, and the $O_2$ flow rate to from 5 sccm to 30 sccm.

Since the first electrode layer 102 includes the same element as that of the metal comprised in the variable resistance layer 103, it is possible to reduce a change in interface profile caused by diffusion of metal element in the variable resistance layer through the repetition of rewrite operation of the memory device. Lastly, the second electrode layer 104 comprising platinum and iridium is formed by a DC sputtering method. The Ir film may be manufactured using Ir target by setting, for example, as a room temperature condition, the chamber pressure to from 0.03 Pa to 3 Pa, and the Ar flow rate to 20 sccm to 100 sccm.

The formation of a tantalum oxide which is an example of the present embodiment will be described in detail. The $TaO_x$ film is manufactured in an oxygen gas atmosphere using Ta target by setting, for example, as a room temperature condition, the chamber pressure to from 0.03 Pa to 3 Pa, using $Ar/O_2$ mixed gas. The composition of the $TaO_x$ film is controlled by the oxygen flow rate in the film formation.

Figure 2:
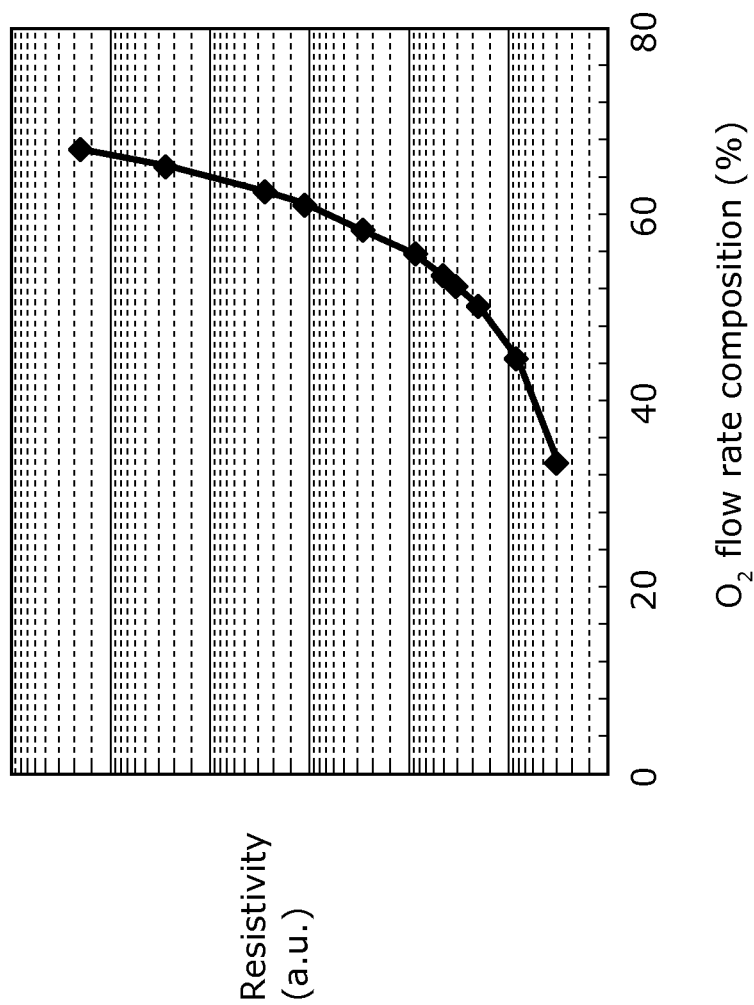
FIG. 2 is a diagram showing a relationship among an oxygen flow ratio, a resistivity of a tantalum oxide thin film, and oxygen content atomic percentage of a tantalum oxide thin film when film is formed according to Embodiment 1.

FIG. 2 shows an example of a relationship between an oxygen flow rate composition in the mixed gas and a resistivity of the $TaO_x$ film. As shown in FIG. 2, when the oxygen flow rate composition increases, the oxygen content atomic percentage and the resistivity in the $TaO_x$ film increase in value. FIG. 2 shows that especially when the oxygen flow rate composition is no less than 60%, a slight difference in the oxygen flow rate composition leads to a large change in the resistivity of the film. Therefore, there is a concern that when the $TaO_x$ film is successively formed for mass production of the $TaO_x$ film, characteristics of the $TaO_x$ film vary depending on conditions such as a degree of oxidation on the target surface and the state of gas absorption in the inner wall of the film deposition chamber, and film deposition accretion.

The $TaO_x$ films (with a film thickness of 30 nm) are successively formed by setting the resistivity corresponding to the oxygen flow rate composition of 60% as a design value, and dependency of the number of substrates provided with a film deposition process is confirmed in a sheet resistance value of each of the formed $TaO_x$ films.

FIG. 3 shows a result. In the process of the first sheet and the second sheet, a sheet resistance value of the $TaO_x$ film significantly changes. This is because of the influence of a film deposition environment before the experiment shown in FIG. 3, such as absorbed gas in the inside of the film deposition chamber, oxidation state of the target, and the like. Therefore, when a plurality of the variable resistance layers are successively formed, in order to stabilize the film deposition environment until the first two sheets at the start of the process, a variable resistance layer may be formed above a dummy substrate different from the substrate before the actual formation of a variable resistance layer above the substrate. The variable resistance layer formed above the dummy substrate may be, for example, a film having the same configuration as that of the variable resistance layer comprised in the variable resistance element and formed above the normal substrate. Specifically, the variable resistance layer may be a film of tantalum oxide used in the above described experiment.

In the third and following processed sheets, although a rate of increase in sheet resistance value slows, a sheet resistance value increases to some extent from the processes of the third sheet to the process of the 25th sheet. The formation of a metal oxide thin film having a high resistivity requires film formation under a condition of a high oxygen flow ratio. When the film is successively formed under such a condition, the oxidation of the metal target surface proceeds according to an increase in the number of the processes. As a result, it is considered that a sheet resistance value of the variable resistance layer is larger.

Therefore, the inventors proposed that as a way to reduce the oxidation of the metal target surface due to introduction of oxygen in the film formation, in the process of forming the second variable resistance layer, one or more inserted layers are provided at a film deposition environment of oxygen flow ratio lower than that of the host layer.

Since the oxygen flow ratio is smaller in the formation of the inserted layer than in the formation of the host layer, it is considered that the progress in the oxidation of the metal target surface is reduced and the metal target surface moves toward reduction. As a result, even when the films are successively formed as shown in FIG. 3, it is considered that it is possible to reduce the progress in the oxidation of the metal target surface by an increase in the number of processed sheets.

The stability of a sheet resistance value of the variable resistance layer with respect to the number of formed films is forecast to be influenced by the structure of the variable resistance layer which includes (1) a film thickness ratio of the host layer and the inserted layer, (2) a resistivity ratio of the host layer and the inserted layer, and (3) the number of inserted layers. Since the inventors consider (1), (2), and (3), the results will be described below.

(1) Film Thickness Ratio of Host Layer and Inserted Layer

Figure 4:
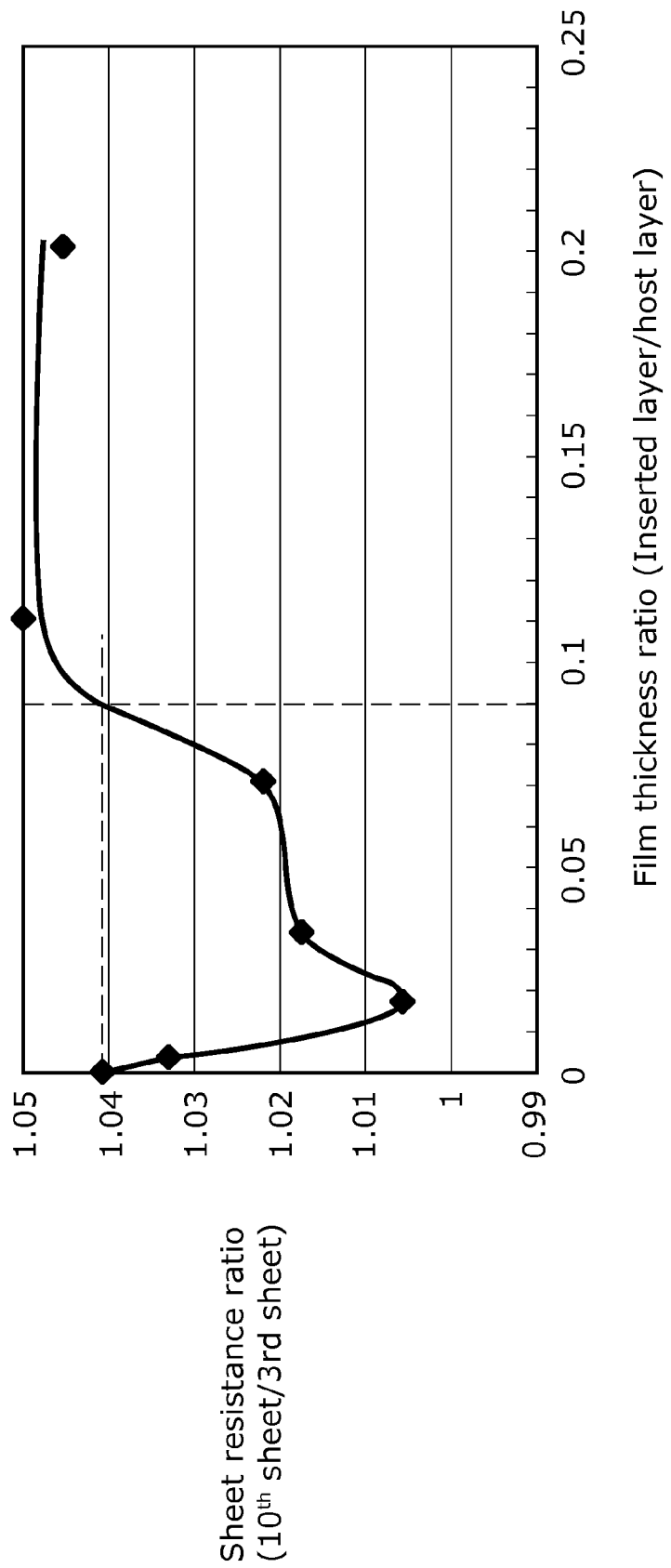
FIG. 4 is a graph showing a relationship between a film thickness ratio of the inserted layer to the host layer according to Embodiment 1 and a ratio of the sheet resistance value of the 10th sheet to the third processed sheet when the film is successively formed.

FIG. 4 shows a relationship between (i) the ratio of the film thickness of the inserted layer to the film thickness of the host layer and (ii) a sheet resistivity of the variable resistance layer. Here, the ratio of the film thickness of the inserted layer to the film thickness of the host layer is represented by a ratio of the film thickness of the inserted layer to the total of the film thicknesses of all the host layers. Moreover, the sheet resistivity of the variable resistance layer is represented by the ratio of a resistance value of the 10th sheet of the variable resistance layer to a resistance value of the third sheet of the variable resistance layer, among the variable resistance layers successively formed in a single structure.

Data of FIG. 4 shows a result for each of the evaluations of the successively manufactured variable resistance layers in each of a plurality of structures having different ratios of the film thickness of the inserted layer to the film thickness of the host layer. Each of the structures comprises a single inserted layer comprising tantalum oxide with resistivity of 1 mΩcm which is provided between two layers of the host layers comprising tantalum oxide with resistivity of 100 mΩcm and having the equal film thickness, and the total film thickness of the variable resistance layer comprising the two host layers and the single inserted layer is 30 nm for the structures. Moreover, the structures are different in that the film thicknesses of the inserted layers are 0, 0.1, 0.5, 1, 2, 3, and 5 nm, respectively (the ratios of the film thickness of the inserted ratio to the film thickness of the host layer are 0, 0.003, 0.017, 0.034, 0.071, 0.11, and 0.2, respectively). The variable resistance layer with the film thickness of the inserted layer of 0 is not provided with the inserted layer.

From FIG. 4, when the film thickness of the inserted layer is 0.5 nm and the total of the film thicknesses of the host layers is 29.5 nm (when the film thickness ratio of the inserted layer to the host layer is 0.017), the ratio of the sheet resistance value is the smallest. From FIG. 4, when the film thickness ratio of the inserted layer to the host layer is greater than 0 and smaller than 0.09, the sheet resistance ratio decreases compared with the case where the inserted layer is not provided. When the film thickness ratio of the inserted layer to the host layer exceeds 0.1, the sheet resistance ratio tends to saturate.

(2) Resistivity Ratio of Host Layer and Inserted Layer

Figure 5:
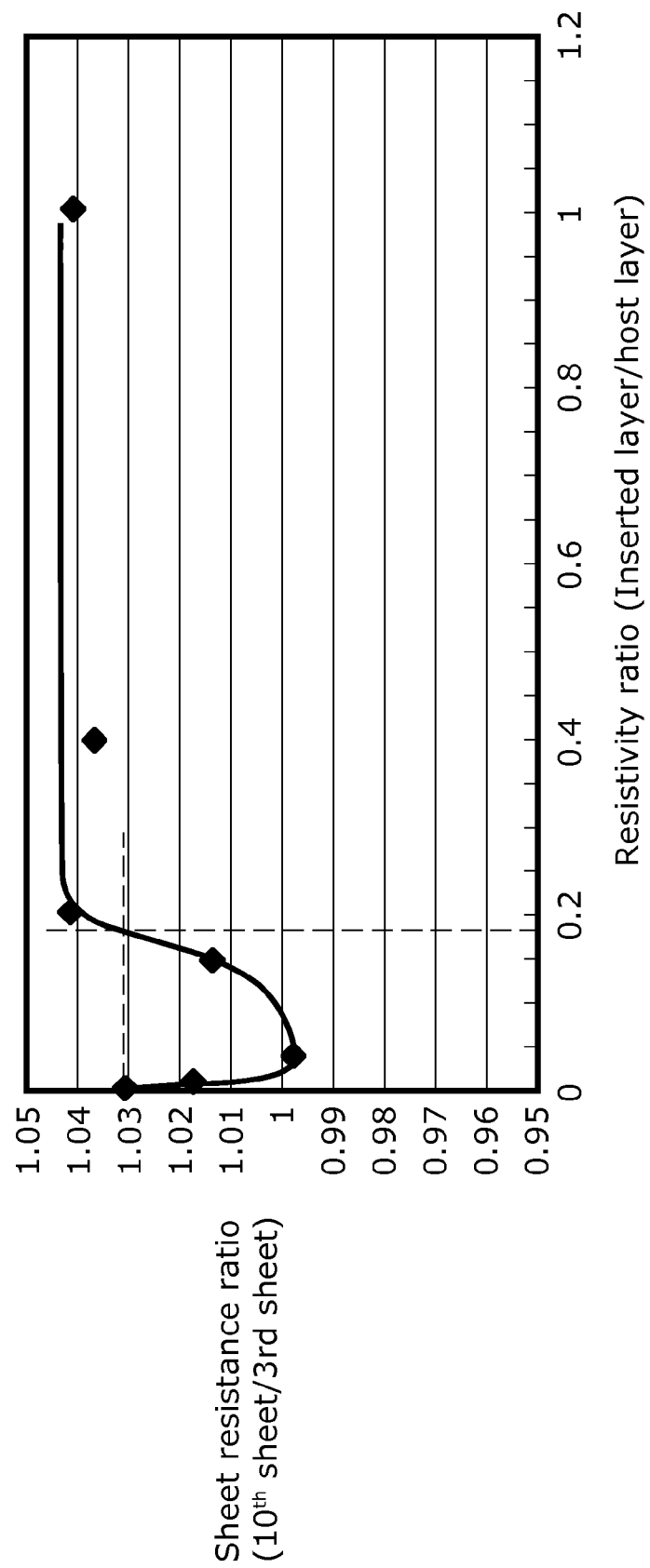
FIG. 5 is a graph showing a relationship between a resistivity ratio of the inserted layer to the host layer according to Embodiment 1 and a ratio of the sheet resistance value of the 10th sheet to the third processed sheet when the film is successively formed.

FIG. 5 shows a relationship between (i) the ratio of the resistivity of the inserted layer to the resistivity of the host layer and (ii) a sheet resistivity of the variable resistance layer. Here, the ratio of the sheet resistance value of the variable resistance layer is represented by the ratio of a sheet resistance value of the 10th sheet of the variable resistance layer to a sheet resistance value of the third sheet of the variable resistance layer, among the variable resistance layers successively formed in a single structure.

Data of FIG. 5 shows a result for each of the evaluations of the successively manufactured variable resistance layers in each of a plurality of structures having different ratios of the resistivity of the inserted layer to the resistivity of the host layer. Each of the structures comprises a single inserted layer comprising tantalum oxide with a film thickness of 1 nm which is provided between two layers of the host layers comprising tantalum oxide with resistivity of 100 mΩcm and having the film thickness of 14.5 nm, and the total film thickness of the variable resistance layer comprising the two host layers and the single inserted layer is equal to 30 nm for the structures. Moreover, the structures are different in that the resistivity of the inserted layers are 0.3, 1, 4, 15, 20, 40, 100 mΩcm, respectively (the ratios of the resistivity of the inserted layer to the resistivity of the host layer are 0.003, 0.01, 0.04, 0.15, 0.2, 0.4, and 1.0, respectively). The variable resistance layer with the resistivity of the inserted layer that is 100 mΩcm equal to the resistivity of the host layer is not provided with the inserted layer.

From FIG. 5, when the resistivity of the inserted layer is 4 mΩcm (when the resistivity ratio of the inserted layer to the host layer is 0.04), the sheet resistance value ratio is the smallest. From FIG. 5, when the resistivity ratio of the inserted layer to the host layer is greater than 0 and smaller than 0.18, the sheet resistance ratio decreases compared with the case where the inserted layer is not provided. When the resistivity ratio of the inserted layer to the host layer exceeds 0.2, the sheet resistance ratio tends to saturate.

(3) The Number of Stacked Inserted Layers

Figure 6:
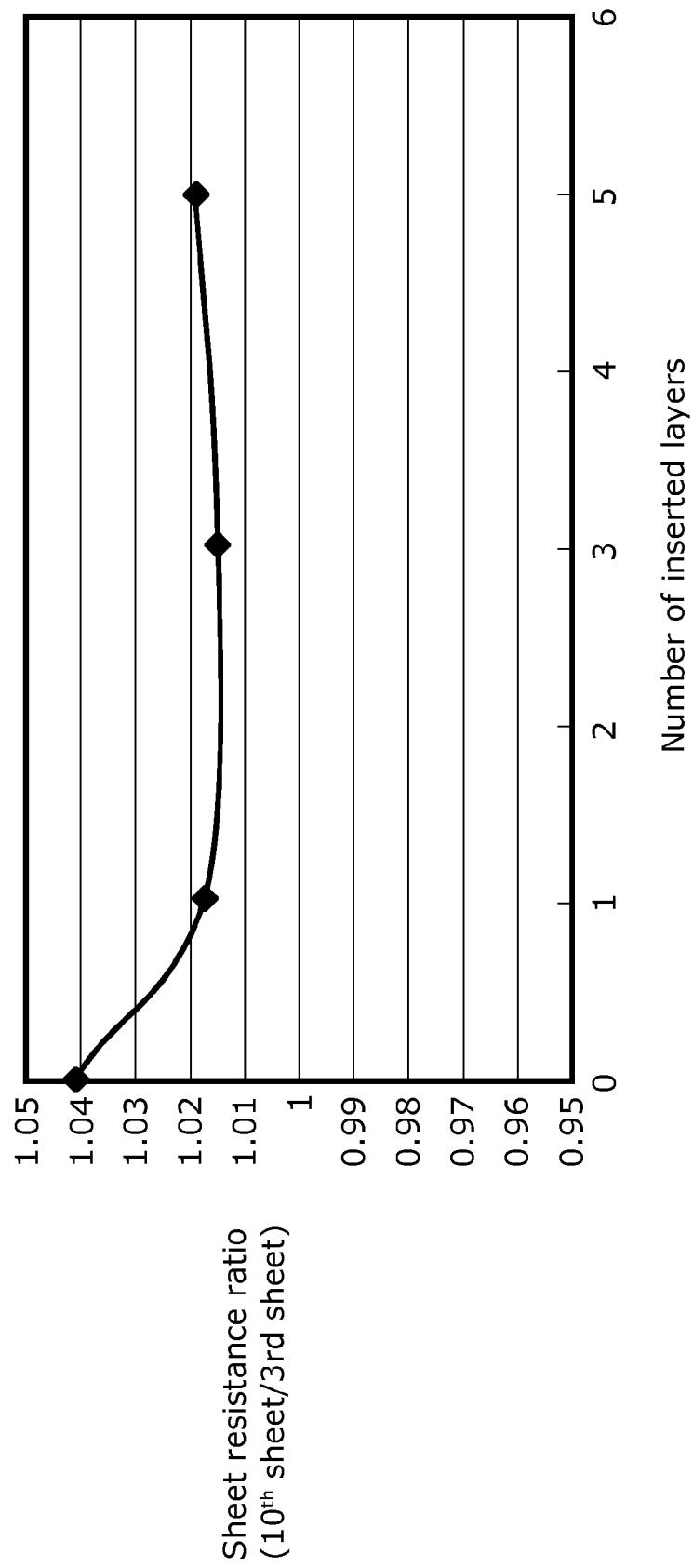
FIG. 6 is a graph showing a relationship between the number of inserted layers according to Embodiment 1 and a ratio of a sheet resistance value of the 10th sheet to the third processed sheet when the film is successively formed.

FIG. 6 shows a relationship between the number of inserted layers and the ratio of the sheet resistance value of the variable resistance layer. Here, the ratio of the sheet resistance value of the variable resistance layer is represented by the ratio of a sheet resistance value of the 10th sheet of the variable resistance layer to a sheet resistance value of the third sheet of the variable resistance layer, among the variable resistance layers successively formed in a single structure.

Data of FIG. 6 shows a result for each of the evaluations of the successively manufactured variable resistance layers in each of a plurality of structures having different numbers of inserted layers. In each of the structures, each of one or more single inserted layers comprising tantalum oxide with a total film thickness of 1 nm and resistivity of 1 mΩcm are provided between the host layers comprising tantalum oxide with resistivity of 100 mΩcm and having the equal film thickness, and the total film thickness of the variable resistance layer comprising the two host layers and the one or more inserted layers is equal to 30 nm for the structures. Moreover, the respective numbers of inserted layers in the structures are 0, 1, 3, and 5. The variable resistance layer with the total number of inserted layers of 0 is not provided with the inserted layer.

FIG. 6 shows that the ratio of the sheet resistance value decreases when at least one inserted layer is provided compared with the case where no inserted layer is provided. FIG. 6 also shows that even when the number of inserted layers increases to one, three, and five, the ratio of the sheet resistance value is approximately constant under a condition that the total of the film thicknesses of the inserted layers is constant. From this, it is estimated that the ratio of the sheet resistance value is constant regardless of the number of inserted layers and the film thickness per layer, as long as the total of the film thicknesses of the inserted layers is constant.

As described above, the formation of the second variable resistance layer may be performed not only by providing one inserted layer between the host layers but also by repeating the process of forming the inserted layer above the host layer to form another host layer in the final stage after the inserted layer and the host layer are formed two or more each. Even with this configuration, as shown in FIG. 6, the sheet resistivity almost the same as that of when the number of inserted layers is one can be obtained (the ratio of a sheet resistance value of the 10th sheet of the variable resistance layer to a sheet resistance value of the third sheet of the variable resistance layer, among the variable resistance layers that are successively formed).

Embodiment 2

Figure 7:
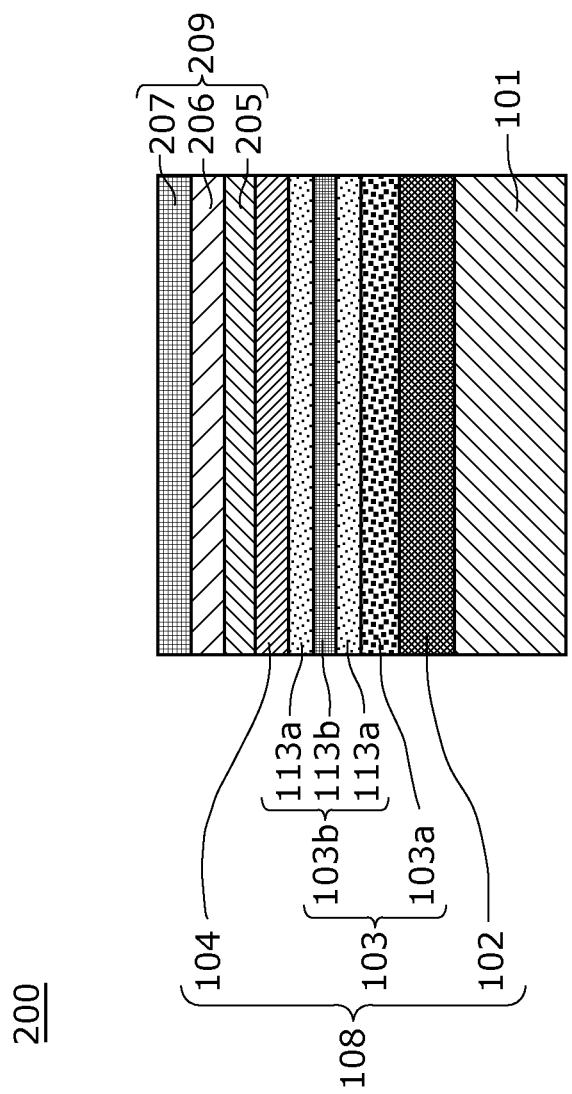
FIG. 7 is a cross-sectional view showing an example of a configuration of a nonvolatile memory element according to Embodiment 2.

FIG. 7 is a cross-sectional view showing an example of a configuration of a variable resistance nonvolatile memory element 200 according to Embodiment 2.

As shown in FIG. 7, the nonvolatile memory element 200 according to Embodiment 2 comprises: a substrate 101; and a variable resistance element 108 which includes a first electrode layer 102, a second electrode layer 104, and a variable resistance layer 103; and a non-ohmic element 209 which includes a first conductive layer 205, a semiconductor layer or an insulating layer 206, and a second conductive layer 207.

Since the variable resistance layer 108 is the same as the variable resistance layer 108 shown in Embodiment 1, a detailed description thereof will be omitted. The difference between the present embodiment and Embodiment 1 is that the non-ohmic element 209 is stacked above the variable resistance element 108. The following will describe a method for manufacturing the non-ohmic element 209.

The first conductive layer 205 comprising tantalum nitride is formed above the second electrode layer 104. The formation of tantalum nitride film is performed by a method for sputtering a metal tantalum target in a mixed gas atmosphere of argon and nitrogen, or a so-called reactive sputtering method. As a typical film deposition environment, pressure is set to from 0.08 Pa to 2 Pa, the substrate temperature is set to from 20° C. to 300° C., the flow ratio of nitrogen gas (the ratio of nitrogen flow rate to the total flow rate of argon and nitrogen) is set to from 0% to 40%, and DC power is set to from 100 W to 1300 W. And then, the film formation time is adjusted such that the thickness of the tantalum nitride film is from 20 nm to 100 nm.

Next, a nitrogen-deficient silicon nitride film is used for the semiconductor layer or the insulating layer 206 comprised in the non-ohmic element 209, and a tantalum nitride is used for the second conductive layer 207.

The formation of a nitrogen-deficient tantalum nitride film is performed by a method for sputtering a polycrystalline silicon target in a mixed gas atmosphere of argon and nitrogen, or a so-called reactive sputtering method. As a typical film deposition environment, pressure is set to from 0.08 Pa to 2 Pa, the substrate temperature is set to from 20° C. to 300° C., the flow ratio of nitrogen gas (the ratio of nitrogen flow rate to the total flow rate of argon and nitrogen) is set to from 0% to 40%, and DC power is set to from 100 W to 1300 W. And then, the film formation time is adjusted such that the thickness of the tantalum nitride film is from 5 nm to 20 nm.

Here, since work function of tantalum nitride is 4.6 eV and this is significantly higher than 3.8 eV that is electron affinity of silicon, a Schottky barrier is formed at the interface between (i) the semiconductor layer or the insulating layer 206 and (ii) the second conductive layer 207. In this configuration in which the second conductive layer 207 and the first conductive layer 205 comprise tantalum nitride, the non-ohmic element 209 serves as a bidirectional MSM diode.

Embodiment 3

Figure 8A:
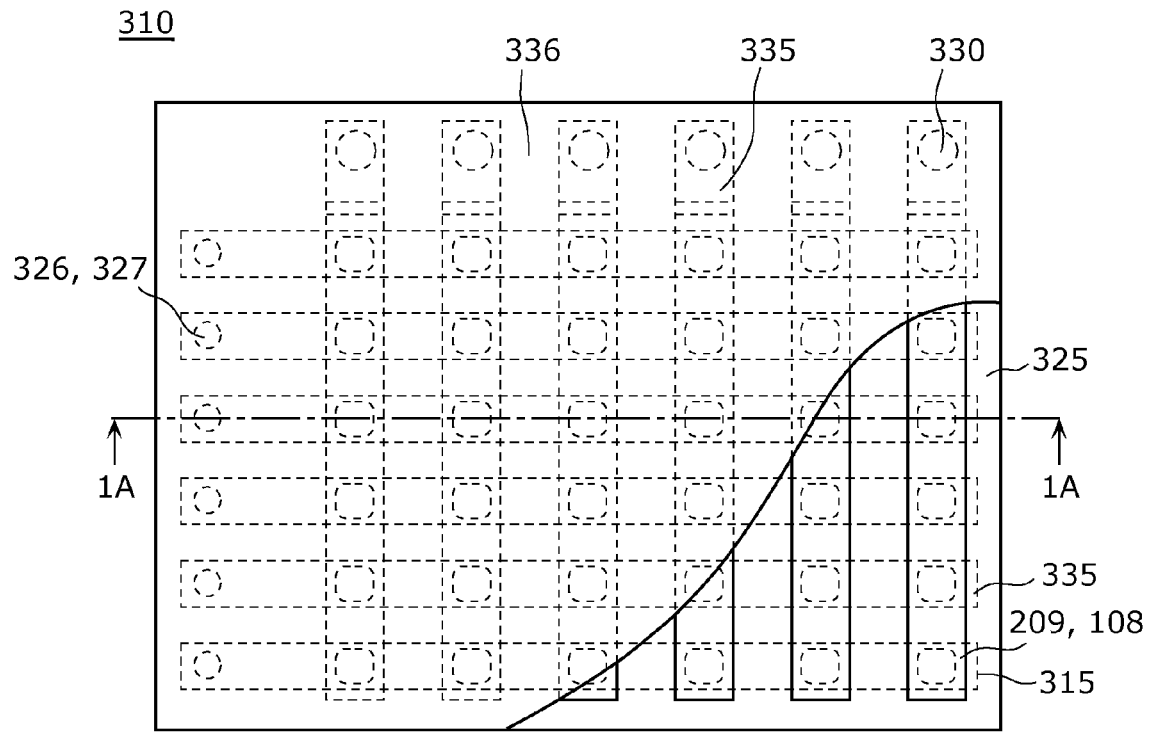
FIG. 8A is a plan view showing an example of a configuration of a nonvolatile semiconductor memory device according to Embodiment 3.
Figure 8B:
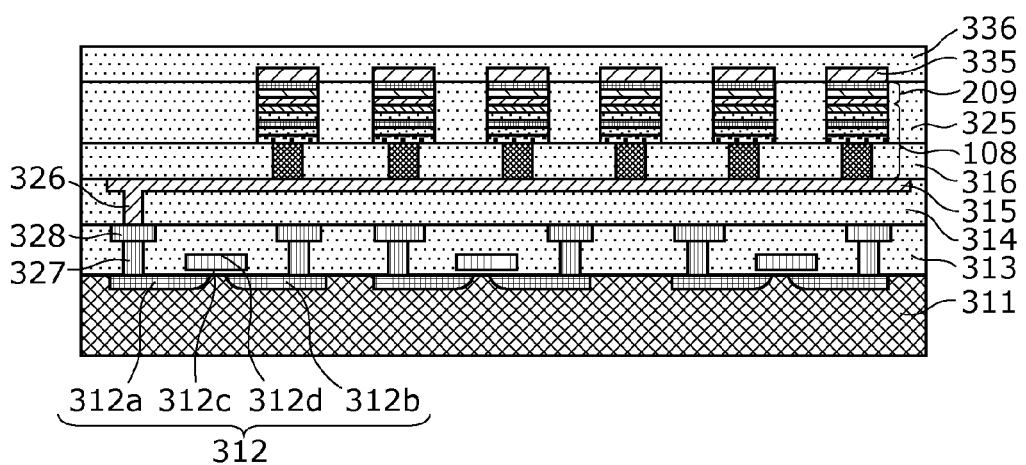
FIG. 8B is a cross-sectional view when a cross section of line 1A-1A shown in FIG. 8A is viewed in an arrow direction.

FIG. 8A is a plan view showing an example of a configuration of a nonvolatile semiconductor memory device 310 according to Embodiment 3. FIG. 8B is a cross-sectional view when a cross section along line 1A-1A shown in FIG. 8A is viewed in an arrow direction. The nonvolatile semiconductor memory device 310 is a cross-point nonvolatile semiconductor memory device comprising the nonvolatile memory element 200 described in Embodiment 2. It should be noted that in the plan view of FIG. 8A, a part of the insulating protective film of the uppermost layer is cut out for making it easier to understand.

Figure 9A:
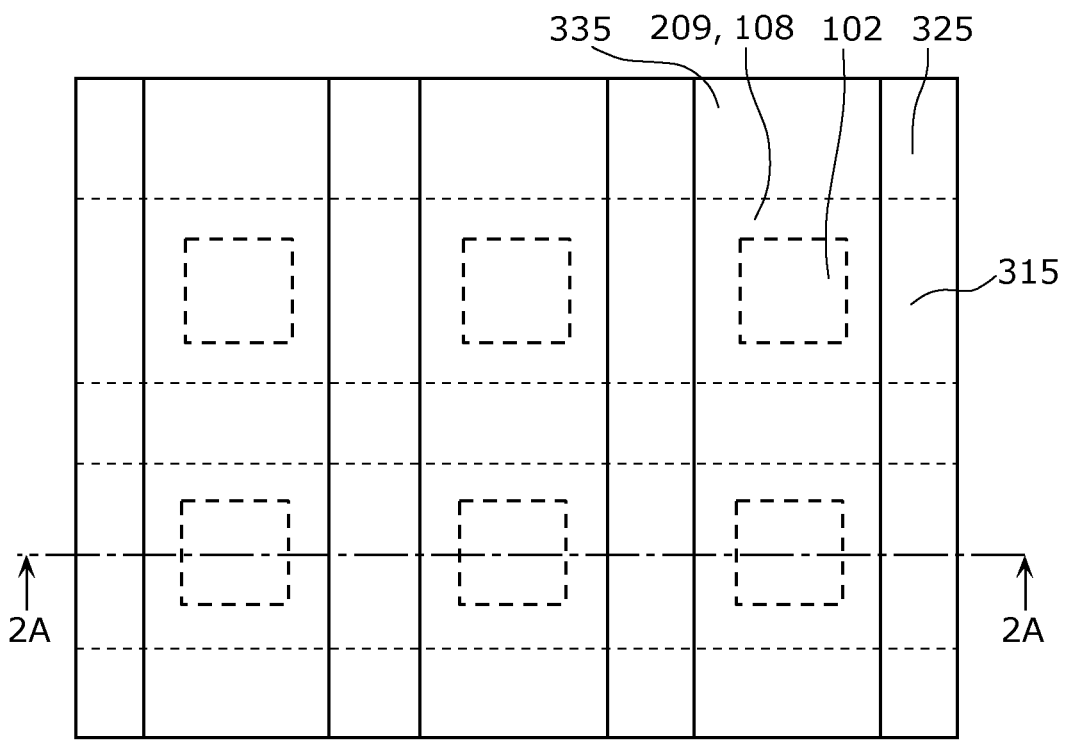
FIG. 9A is a plan view of a key part showing an example of the configurations of a storage unit of the nonvolatile semiconductor memory device and a non-ohmic element according to Embodiment 3.
Figure 9B:
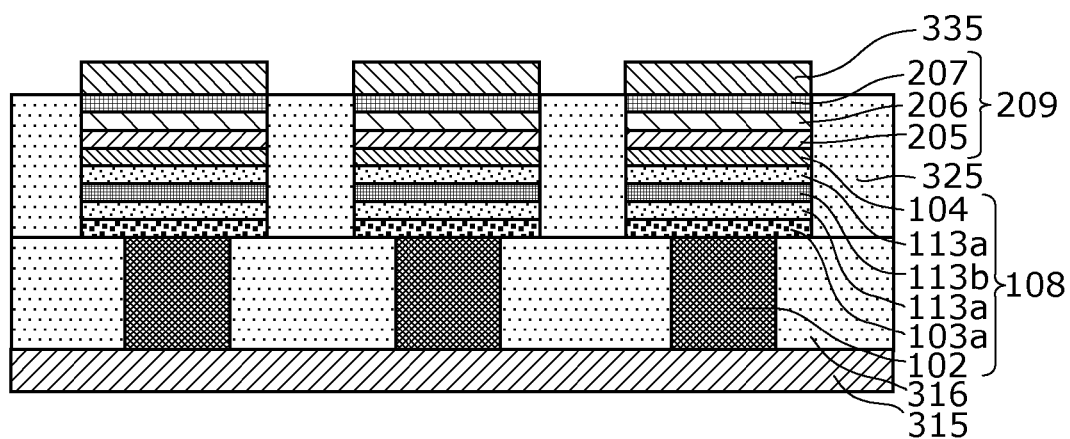
FIG. 9B is a cross-sectional view when a cross section of line 2A-2A shown in FIG. 9A is viewed in an arrow direction.

FIG. 9A is a plan view of a key part for showing an example of the configurations of the variable resistance element 108 and the non-ohmic element 209. FIG. 9B is a cross-sectional view when a cross section along line 2A-2A shown in FIG. 9A is viewed in an arrow direction.

A nonvolatile semiconductor memory device 310 according to the present embodiment includes: a substrate 311; a first electrode wire 315 which is formed above the substrate 311 and is shaped in stripe; an interlayer dielectric 316 which is disposed above the substrate 311 including the first electrode wire 315 and has a contact hole formed opposite to the first electrode wire 315; a first electrode layer 102 which is filled in the contact hole and is connected to the first electrode wire 315; a variable resistance element 108 formed above the first electrode layer 102; and a non-ohmic element 209 formed above the variable resistance element 108.

The non-ohmic element 209 is an MIM diode comprising a three-layer configuration of the first conductive layer 205 that is a metal electrode layer in the present embodiment, the second conductive layer 207 that are metal electrode layers, and the semiconductor layer or the insulating layer 206.

Furthermore, in the present embodiment, an upper layer electrode wire 335 connected to the second conductive layer 207 is formed above the interlayer dielectric in a stripe shape in which the upper layer electrode wire 335 crosses the first electrode wire 315. The variable resistance element 108 is configured by the variable resistance layer 103, the first electrode layer 102 connected to the variable resistance layer 103, the first electrode wire 315 connected to the first electrode layer 102, and the second electrode layer 104. The variable resistance layer 103 may use an oxygen-deficient tantalum oxide. The variable resistance layer 103 comprising the oxygen-deficient tantalum oxide can be manufactured by the reactive sputtering method, for example. At this time, the oxygen content atomic percentage of the variable resistance layer 103 can be controlled by adjusting the oxygen flow rate in the sputtering gas.

The variable resistance layer 103 comprises the first variable resistance layer 103a and the second variable resistance layer 103b. Furthermore, the second variable resistance layer 103b includes the host layer 113a having a degree of oxygen deficiency smaller than that of the first variable resistance layer 103a, and one or more inserted layers 113b having a degree of oxygen deficiency larger than that of the host layer 113a. Moreover, an MIM diode that is the non-ohmic element 209 comprises a three-layer stacked configuration of the first conductive layer 205, the semiconductor layer or the insulating layer 206, and the second conductive layer 207.

Furthermore, in the present embodiment, the substrate 311 has a semiconductor circuit in which active elements 312 such as a transistor are integrated using silicon single crystal substrate. In FIG. 8B, the active element 312 is a transistor comprising source and drain regions 312a and 312b, a gate insulating film 312c, and a gate electrode 312d. However, above the substrate 311, not only these active elements 312 but also an element necessary a memory circuit such as DRAM may be included.

The first electrode wire 315 and the upper layer electrode wire 335 are each connected to the active element 312 in a region that is different from a matrix region in which the variable resistance element 108 and the non-ohmic element 209 are formed. In other words, in FIG. 8B, the first electrode wire 315 is connected to the source and drain region 312a of the active element 312 via embedded conductors 326 and 327, and a semiconductor electrode wire 328. It should be noted that the upper layer electrode wire 335 is similarly connected to another active element (not illustrated) via the embedded conductor 330.

The first electrode wire 315 can be easily formed through sputtering using a Ti—Al—N alloy, Cu, or Al, and then through an exposure process and an etching process. The variable resistance layer 103 comprised in the variable resistance element 108 may be formed not only the above described tantalum oxide but also a transition metal such as titanium oxide, vanadium oxide, cobalt oxide, nickel oxide, zinc oxide, and niobium oxide film, by the sputtering method. The transition metal oxide shows a specific resistance value when a voltage or a current with a value more than a threshold is applied, and the resistance value is maintained until a certain magnitude of pulse voltage or pulse current is applied.

Moreover, an insulating oxide material can be used for the interlayer dielectrics 316 and 325 and the insulating protective layer 336. Specifically, it is possible to use TEOS-SiO film or silicon nitride (SiN) film which are formed by the CVD method using silicon oxide (SiO), ozone ($O_3$), and tetraethoxysilane (TEOS) by the CVD method. A low dielectric material such as silicon carbon nitride (SiCN), silicon oxycarbite (SiOC) film, or silicon oxyfluoride (SiOF) film may be used.

Next, as the second conductive layer 207 of the non-ohmic element 209, an MIM diode which uses tantalum (Ta), aluminum (Al), and which stacks, by using the combination of the two, silicon nitride (SiN) as the semiconductor layer or the insulating layer 206. It should be noted that although not only Al but also Ti or Cr can be used as the electrode, wire resistance increases when Al, Ti, or Cr is used as the electrode. Therefore, a thin film comprising Al, Cu, or the like may be further stacked and formed. It is desirable that the first conductive layer 205 comprises a metal nitride comprising a metal comprising the variable resistance layer 103. For example, in Embodiment 3, tantalum nitride which is tantalum nitride comprised in the variable resistance layer 103 may be used for the first conductive layer 205.

Figure 10:
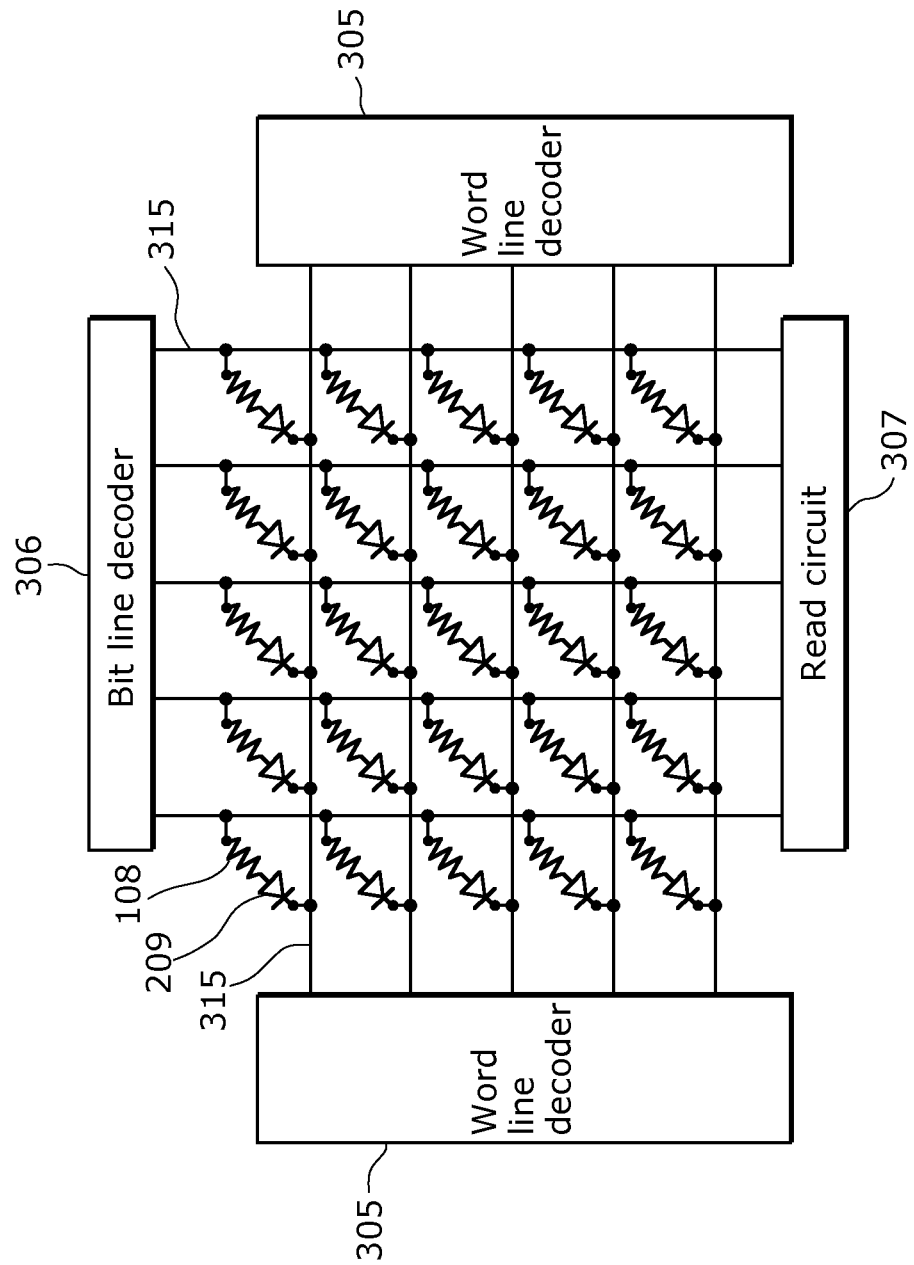
FIG. 10 is a block diagram for explaining an outline of a circuit configuration of the nonvolatile semiconductor memory device according to Embodiment 3.

FIG. 10 is a block diagram for explaining an outline of a circuit configuration of a nonvolatile semiconductor memory device 310 according to the present embodiment. As shown in FIG. 10, the variable resistance element 108 and the non-ohmic element 209 are connected in series, the variable resistance element 108 has one end connected to the first electrode wire 315, and the non-ohmic element 209 has one end connected to the upper layer electrode wire 335. The first electrode wire 315 is connected to a bit line decoder 306 and a read circuit 307. Moreover, the upper layer electrode wire 335 is connected to a word line decoder 305. As described above, the first electrode wire 315 becomes a bit line, and the upper layer electrode wire 335 becomes a word line. These are arranged in matrix. Furthermore, the bit line decoder 306, the word line decoder 305, and the read circuit 307 are configured as peripheral circuits. The peripheral circuits are each configured by the active element 312 comprising MOSFET, for example.

Next, a method for manufacturing the nonvolatile semiconductor memory element 310 according to the present embodiment will be described with reference to FIGS. 11 to 16.

Figure 11:
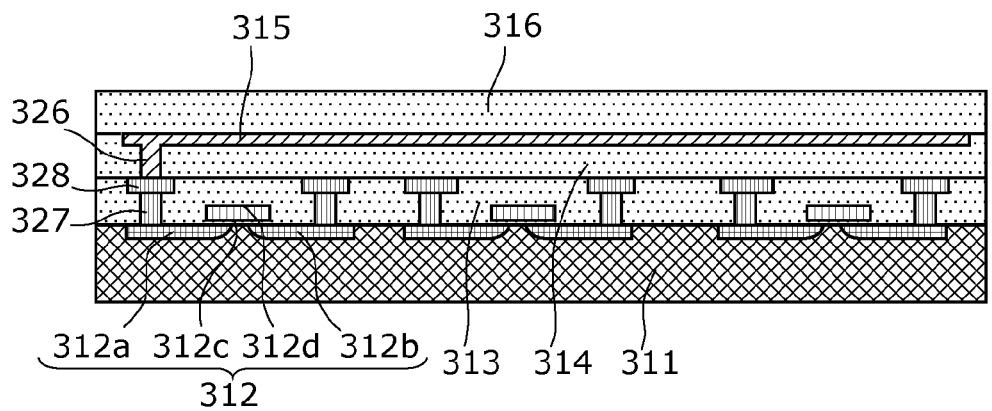
FIG. 11 is a cross-sectional view showing an example of a method for manufacturing the nonvolatile semiconductor memory device according to Embodiment 3.

FIG. 11 is a cross-sectional view showing the state in which the interlayer dielectric 316 is formed above the substrate 311 in which the active element 312 is formed.

Figure 12A:
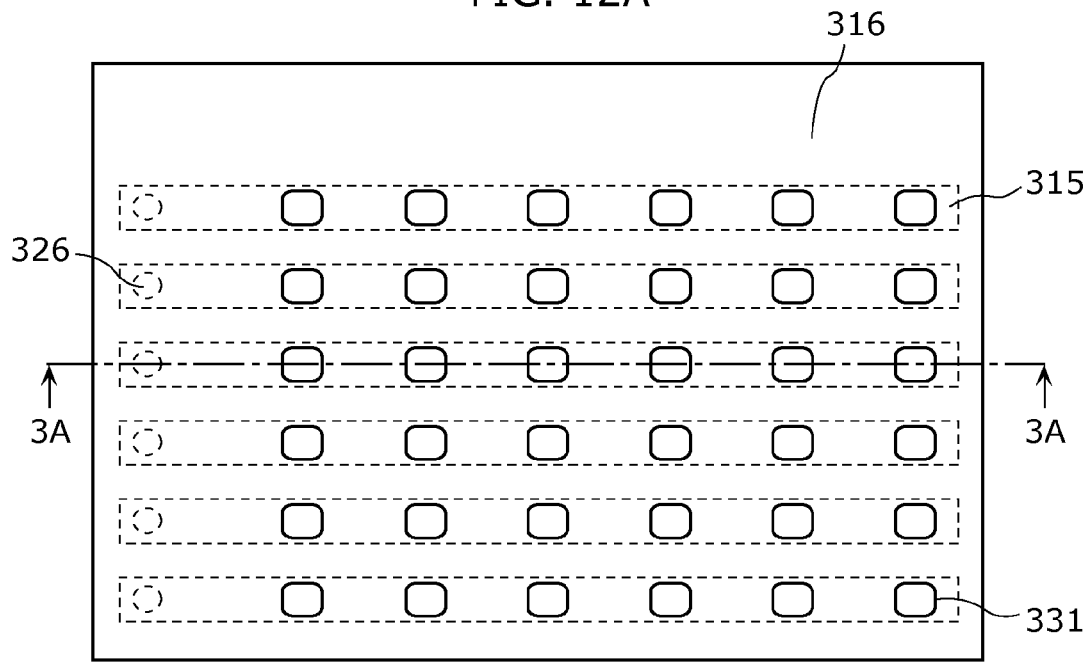
FIG. 12A is a plan view showing an example of a method for manufacturing the nonvolatile semiconductor memory device according to Embodiment 3.
Figure 12B:
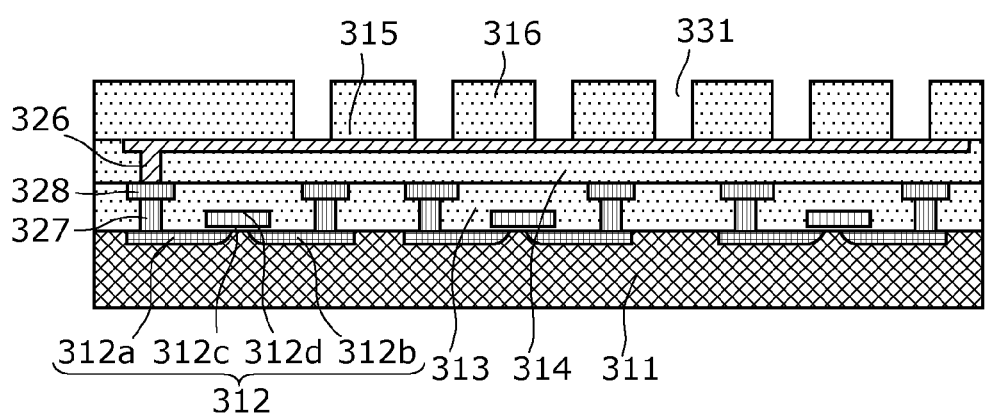
FIG. 12B is a cross-sectional view when a cross section of line 3A-3A shown in FIG. 12A is viewed in an arrow direction.

FIG. 12A is a plan view showing the state in which a contact hole 331 is formed in the interlayer dielectric 316. FIG. 12B is a cross-sectional view when a cross section of line 3A-3A shown in FIG. 12A is viewed in an arrow direction.

Figure 13:
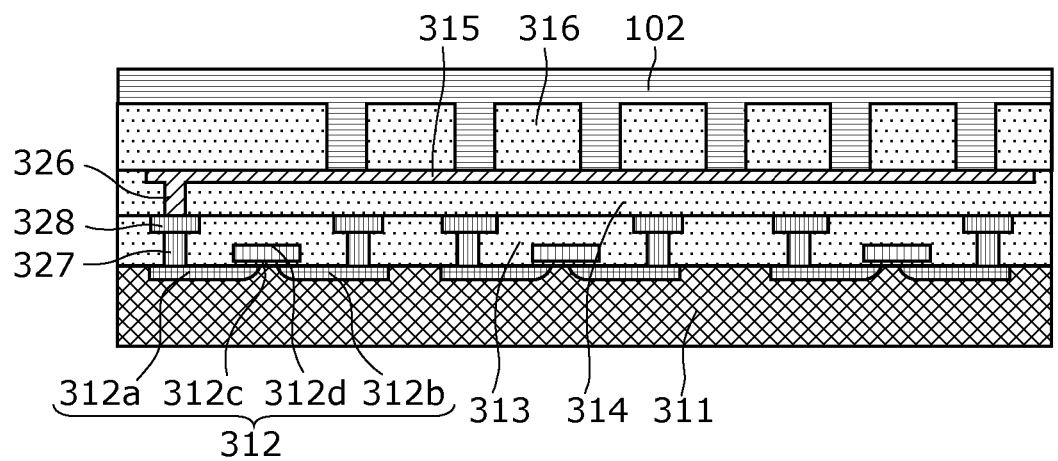
FIG. 13 is a cross-sectional view showing an example of a method for manufacturing the nonvolatile semiconductor memory device according to Embodiment 3.

FIG. 13 is a cross-sectional view showing the state in which a material to be the first electrode layer 102 is arranged in the contact hole 331 and above the interlayer dielectric 316.

Figure 14:
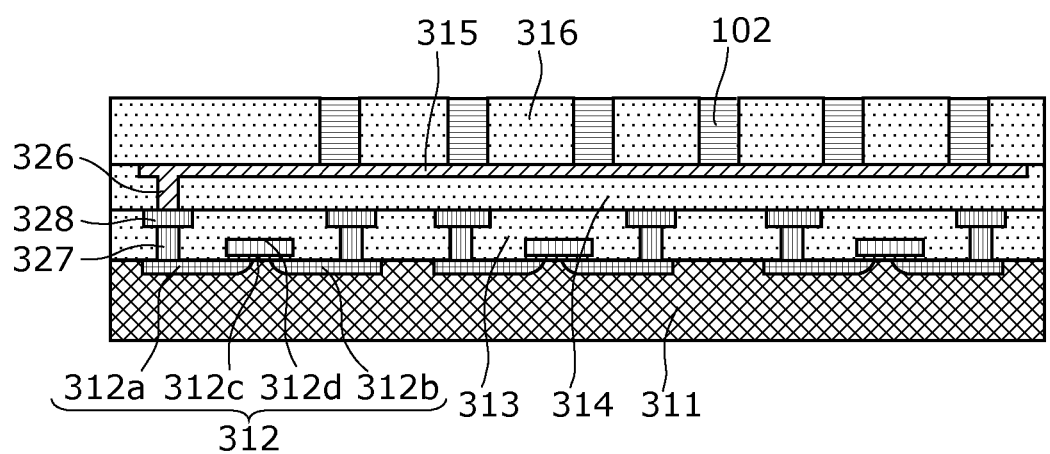
FIG. 14 is a cross-sectional view showing an example of a method for manufacturing the nonvolatile semiconductor memory device according to Embodiment 3.

FIG. 14 is a cross-sectional view of the state in which the material of the first electrode layer 102 above the interlayer dielectric 316 is removed by CMP.

Figure 15A:
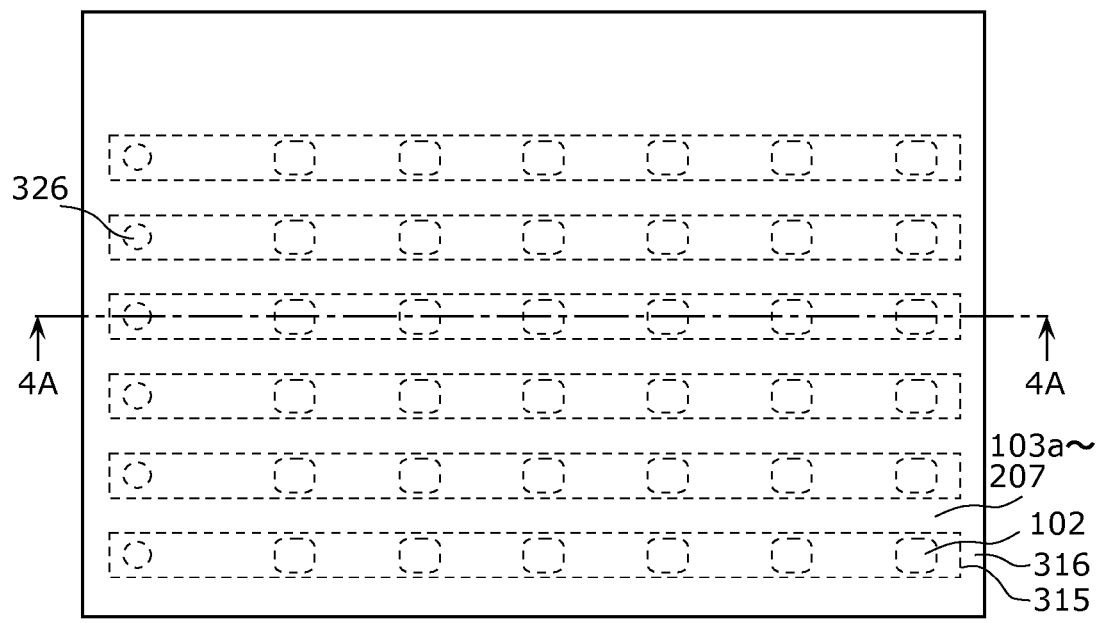
FIG. 15A is a plan view showing an example of a method for manufacturing the nonvolatile semiconductor memory device according to Embodiment 3.
Figure 15B:
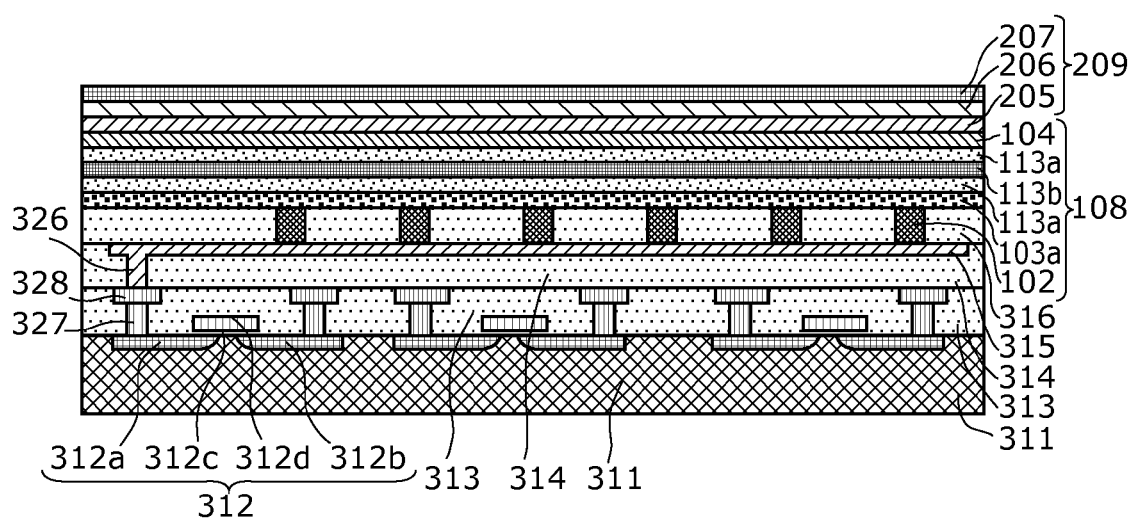
FIG. 15B is a cross-sectional view when a cross section of line 4A-4A shown in FIG. 15A is viewed in an arrow direction.

FIG. 15A is a plan view showing the state in which a stacked film is formed which comprises a material of the variable resistance element 108 and the non-ohmic element 209. FIG. 15B is a cross-sectional view when a cross section of line 4A-4A shown in FIG. 15A is viewed in an arrow direction.

Figure 16A:
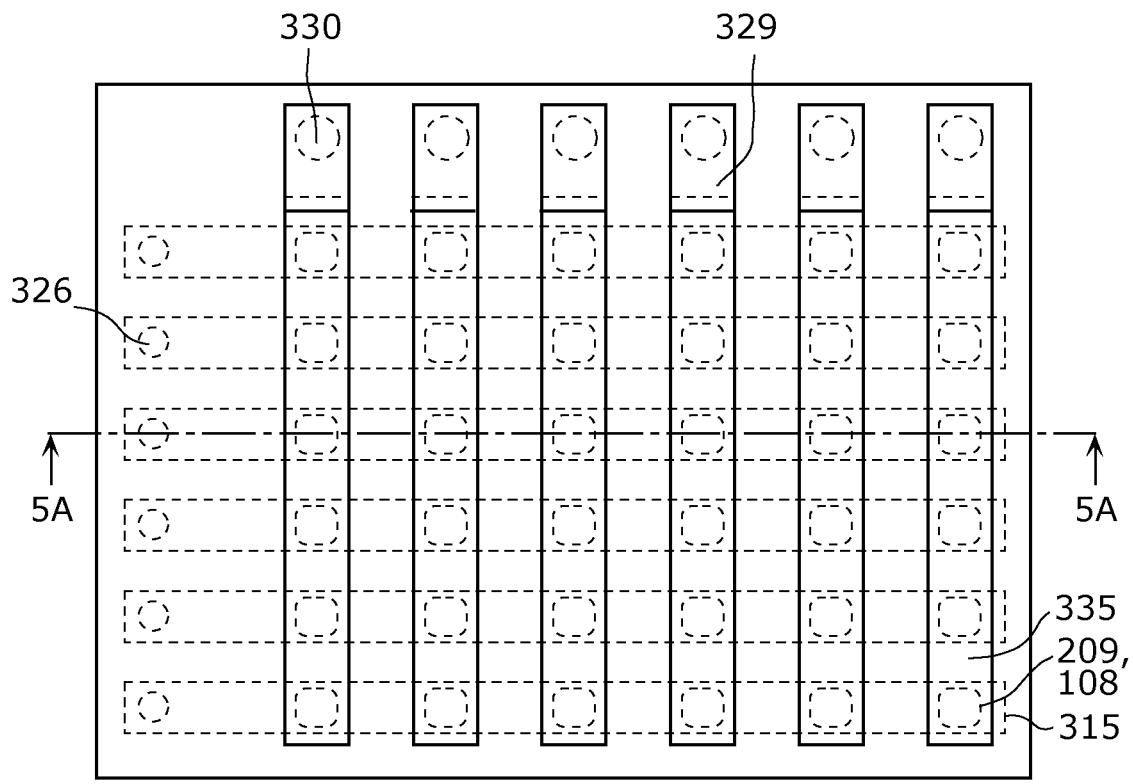
FIG. 16A is a plan view showing an example of a method for manufacturing the nonvolatile semiconductor memory device according to Embodiment 3.
Figure 16B:
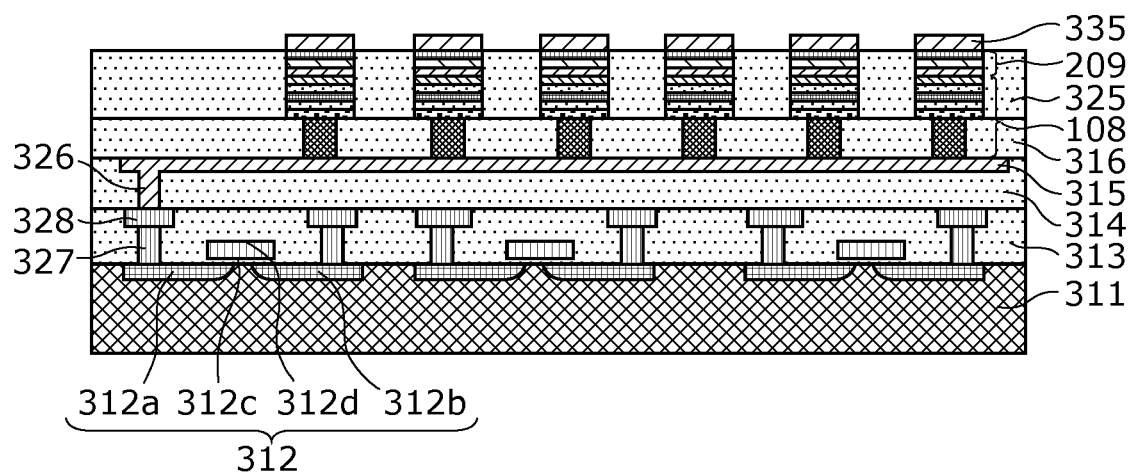
FIG. 16B is a cross-sectional view when a cross section of line 5A-5A shown in FIG. 16A is viewed in an arrow direction.

FIG. 16A is a plan view showing the state in which a stacked film which comprises a material of the variable resistance element 108 and the non-ohmic element 209 is processed into each of the shapes of the nonvolatile memory elements, and then the upper layer electrode wire 335 is formed. FIG. 16B is a cross-sectional view when a cross section of line 5A-5A shown in FIG. 16A is viewed in an arrow direction.

First, as shown in FIG. 11, the first electrode wire 315 and the interlayer dielectric 316 are formed above the substrate 311 above which the active elements 312, the semiconductor electrode wire 328, the semiconductor interlayer dielectric 313 and 314 are formed. Aluminum has been so far used for the semiconductor electrode wire 328. However, currently, copper is mainly used because low resistance can be realized even after miniaturization. Moreover, fluorine contained oxide (e.g., SiOF), carbon contained nitride (e.g., SiCN), or organic resin material (e.g., polyimide) is used for the semiconductor interlayer dielectrics 313 and 314, in order to reduce interconnection parasitic capacitance. Also in the present embodiment, copper, for example, can be used for the semiconductor electrode wire 328, and SiOF that is fluorine contained oxide, for example, can be used for the semiconductor interlayer dielectrics 313 and 314.

It should be noted that the first electrode wire 315 is formed by filling in the semiconductor interlayer dielectric 314. This can be formed by the following method. In other words, a groove shaped in stripe for embedding the first electrode wire 315 in the semiconductor interlayer dielectric 314 and a contact hole for connecting to the semiconductor electrode wire 328 are formed. These can be easily formed using a technique used in the general semiconductor process.

After the groove and the contact hole are formed and after a conductor film to be the first electrode wire 315 is formed, the use of CMP makes it possible to form the first electrode wire 315 shown in FIG. 11. It should be noted that as the first electrode wire 315, not only a Ti—Al—N alloy but also Cu, Al, a Ti—Al alloy, or a stacked configuration of these may be used.

Next, as shown in FIG. 11, above the substrate 311 including the first electrode wire 315, the interlayer dielectric 316 comprising TEOS-SiO is formed using the CVD method, for example. It should be noted that various materials, as described above, can be used for the interlayer dielectric 316.

Furthermore, as shown in FIGS. 12A and 12B, contact holes 331 are formed at a constant arrangement pitch in the interlayer dielectric 316 above the first electrode wire 315. Each of the contact hole 331, as seen from FIG. 12B, has an external form whose width is smaller than that of the first electrode wire 315. Although the contact hole 331 is shaped in square, the contact hole 331 may have any shape such as circle, ellipse, and others. Since the contact hole 331 can be formed by the general semiconductor process, a detailed description thereof will be omitted.

Next, as shown in FIG. 13, a conductor film to be the first electrode layer 102 is formed in the contact hole 331 and above the interlayer dielectric 316. In the present embodiment, tantalum nitride is formed. The tantalum nitride film may be manufactured in a nitride gas atmosphere using Ta target by setting, for example, as a room temperature condition, the chamber pressure to from 0.03 Pa to 3 Pa, and the Ar flow rate to 20 sccm, and the $N_2$ flow rate to from 5 sccm to 30 sccm. It should be noted that the film formation method may be not only the sputtering method but also the CVD method and the ALD method.

As shown in FIG. 14, the conductor film covering the surface of the interlayer dielectric 316 is removed using the CMP process, and the first electrode layer 102 filling in the contact hole 331 is formed.

Next, as shown in FIGS. 15A and 15B, tantalum oxide film to be the variable resistance layer 103 is deposited above the first electrode layer 102 and the interlayer dielectric 316 by the reactive sputtering method. The tantalum oxide film may be manufactured in an oxygen gas atmosphere using Ta target by setting, for example, as a room temperature condition, the chamber pressure to from 0.03 Pa to 3 Pa, and the Ar flow rate to 20 sccm, and the $O_2$ flow rate to from 5 sccm to 30 sccm. It should be noted that the film formation method may be not only the sputtering method but also the CVD method, the ALD method, and the like.

Here, in the variable resistance layer 103, after the first variable resistance layer 103a is formed, the host layer 113a is formed under a condition of a higher oxygen flow ratio, the inserted layers 113b are successively formed by setting an oxygen flow ratio lower than that in the formation of the host layer 113a, and then the host layer 113a is formed again. Although FIG. 15B shows the case where the number of inserted layer is one, the number of inserted layers is not limited to one as long as the total number is at least one. Moreover, when the variable resistance layer is tantalum oxide, the film thickness ratio of the inserted layer 113b comprised in the second variable resistance layer 103b to the host layer 113a may be larger than 0 and smaller than 0.09. Furthermore, when the variable resistance layer is tantalum oxide, the resistivity ratio of the inserted layer 113b comprised in the second variable resistance layer 103b to the host layer 113a may be larger than 0 and smaller than 0.18.

Furthermore, above the tantalum oxide film to be the variable resistance layer 103, material films for each of the second electrode layer 104, the first conductive layer 205 comprised in the non-ohmic element 209, the semiconductor layer or the insulating layer 206, and the second conductive layer 207 are stacked and formed.

Here, in the second electrode layer 104, an iridium electrode film with a film thickness of 50 nm is formed by a DC sputtering method. Moreover, in the first conductive layer 205 and the second conductive layer 207, aluminum is formed by the sputtering method. In the semiconductor layer or the insulating layer 206, silicon nitride is formed by the reactive sputtering method. By forming SiN by the sputtering method, SiN has good insulation properties and makes it easier to form a fine thin film.

Next, as shown in FIGS. 16A and 16B, after the processing of a stacked structure of the material films by a dry etching process into individual nonvolatile memory device shapes, the upper layer electrode wire 335 is formed.

Here, the upper layer electrode wire 335 is formed to be connected to the second conductive layer 207 in a region in which the variable resistance element 108 and the MIM diode that is the non-ohmic element 208 are formed in matrix. A material for the upper layer electrode wire 335 can be the same as that for the first electrode wire 315. When the upper layer electrode wire 335 is formed, the embedded conductor 330 is also simultaneously formed. The upper layer electrode wire 335 is connected to a semiconductor electrode wire (not illustrated) via the embedded conductor 330, and is electrically connected to an active element provided at the non-illustrated position.

Subsequently, by forming the insulating protective layer 336 which covers the upper layer electrode wire 335, it is possible to manufacture the nonvolatile semiconductor memory device 310 shown in FIG. 8.

It should be noted that in the present embodiment, as an example of the non-ohmic element 209, the MIM diode which uses SiN as the semiconductor layer or the insulating layer 206 has been described. However, the non-ohmic element 209 is not limited to such. For the non-ohmic element 209, the MIM diode which includes the semiconductor layer or the insulating layer 206 which comprises tantalum oxide (TaO), alumina (AlO), or tinania (TiO) may be used. When TaO is used for the semiconductor layer or the insulating layer 206, for example, after the formation of Ta film, the semiconductor layer or the insulating layer 206 may be formed using one of (i) any oxidation methods that are a dry thermal oxidation method, a wet thermal oxidation method, or a plasma oxidation method, or (ii) a method of directly forming $TaO_x$ film using a reactive sputtering method.

Modification

In the nonvolatile memory elements 100 and 200 described in Embodiments 1 and 2, as shown in FIGS. 1 and 7 respectively, the first variable resistance layer 103a of the first variable resistance layer 103a and the second variable resistance layer 103b is arranged in a lower layer near the substrate 101, and the second variable resistance layer 103b which comprises the host layers and the inserted layers each provided between each of the adjacent pairs of host layers is arranged in an upper layer far from the substrate 101. However, the arrangements of the first variable resistance layer 103a and the second variable resistance layer 103b may be reversed.

Figure 17:
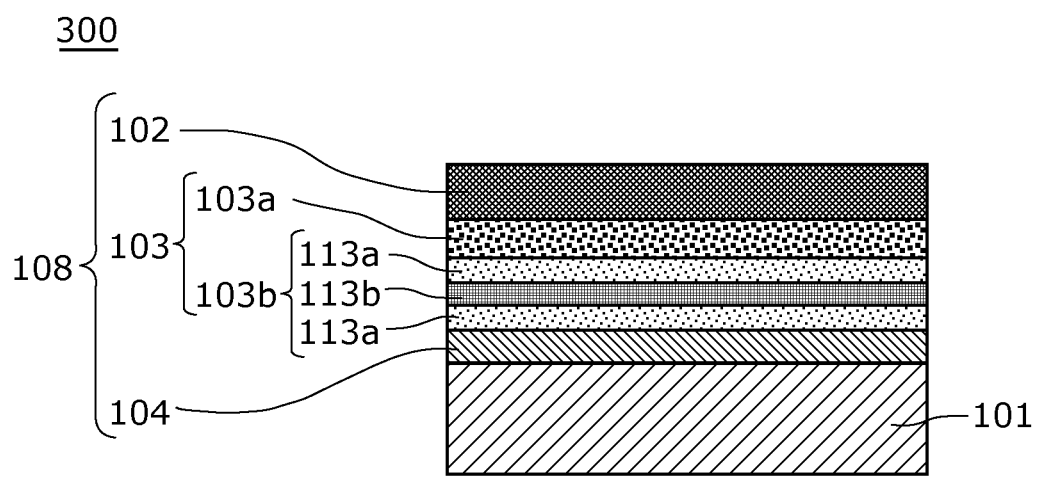
FIG. 17 is a cross-sectional view showing a configuration of a nonvolatile memory element according to Modification.

FIG. 17 is a cross-sectional view showing an example of a configuration of a nonvolatile memory element 300 according to Modification. In the nonvolatile memory element 300 shown in FIG. 17, each of the layers comprised in the variable resistance element 108 is stacked above the substrate 101 in an order opposite to that of the nonvolatile memory element 100.

Figure 18:
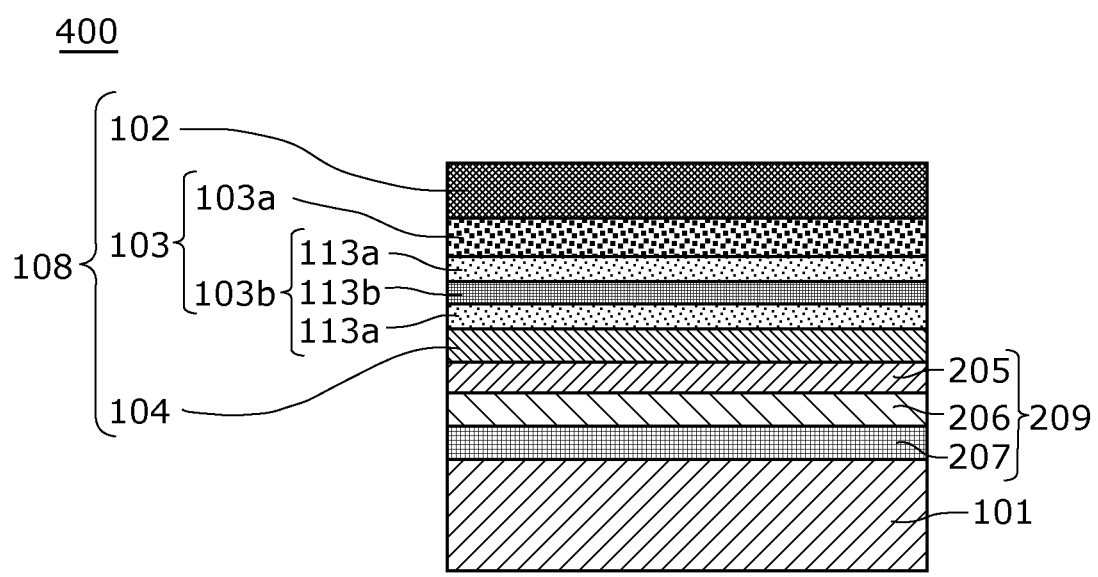
FIG. 18 is a cross-sectional view showing a configuration of a nonvolatile memory element according to Modification.

FIG. 18 is a cross-sectional view showing an example of a configuration of a nonvolatile memory element 400 according to Modification. In the nonvolatile memory element 400 shown in FIG. 18, each of the layers comprised in the variable resistance element 108 and the non-ohmic element 209 is stacked above the substrate 101 in an order opposite to that of the nonvolatile memory element 200.

As shown in FIGS. 17 and 18, even when the second variable resistance layer 103b is arranged in a lower layer near the substrate 101 and the first variable resistance layer 103a is arranged in an upper layer far from the substrate 101, as shown in FIG. 18, even when the non-ohmic element 209 is arranged in a lower layer near the substrate 101 and the variable resistance element 108 is arranged in an upper layer far from the substrate 101, there is no change in that it is easier to maintain a degree of oxygen deficiency of the host layer at an intended degree by providing the second variable resistance layer 103b with the inserted layer. As a result, the effect of stabilizing the variable resistance characteristics of the nonvolatile memory elements is delivered.

Therefore, the present disclosure includes an nonvolatile memory element which includes the first electrode layer 102, the second electrode layer 104, a variable resistance layer 103 which is provided between the first electrode layer 102 and the second electrode layer 104 and has a resistance value that reversibly changes according to the application of an electrical pulse, wherein the variable resistance layer 103 includes the first variable resistance layer 103a which comprises the oxygen-deficient first metal oxide and is in contact with the first electrode layer 102 and the second electrode layer 104 which is in contact with the first variable resistance layer 103a, comprises the inserted layer which includes the oxygen-deficient second metal oxide having a degree of oxygen deficiency larger than that of the first metal oxide, and is provided between each of the adjacent pairs of the host layers 113a, wherein the degree of oxygen deficiency of the first metal oxide of the inserted layer 113b is larger than that of the second metal oxide of the host layer 113a, even when one of the first variable resistance layer 103a and the second variable resistance layer 103b is provided with a lower layer near the substrate 101.

Moreover, the present disclosure includes the nonvolatile memory element which includes the non-ohmic element 209 which is formed in contact with the second electrode layer 104, wherein the non-ohmic element 209 includes the first electrode layer in contact with the second electrode layer 104, the second conductive layer 207, and the semiconductor layer or the insulating layer 206 which is provided between the first conductive layer 205 and the second conductive layer 207, even when the non-ohmic element 209 is provided with a side near the substrate 101 and with a side far from the substrate 101, with respect to the variable resistance element 108.

Moreover, in the method for manufacturing the nonvolatile semiconductor memory device 310 described in Embodiment 3, as an example, the first variable resistance layer 103a is arranged in a lower layer near the substrate 101, and the second variable resistance layer 103b comprising the host layers and the inserted layer provided between an adjacent pair of the host layers is arranged in an upper layer far from the substrate 101. However, the arrangements of the first variable resistance layer 103a and the second variable resistance layer 103b may be reversed.

As described above, even when the second variable resistance layer 103b is arranged in a lower layer, there is no change in that by providing the inserted layer, a degree of oxygen deficiency of the host layer is easier to maintain at an intended degree. As a result, the effect of stabilizing variable resistance characteristics of the nonvolatile memory elements is delivered.

Therefore, the present disclosure includes (i) a method for manufacturing a nonvolatile memory element which includes forming the first electrode layer 102 above the substrate 101, forming the first variable resistance layer 103a comprising the oxygen-deficient first metal oxide above the first electrode layer 102, forming, above the first variable resistance layer 103a, the second variable resistance layer 103b which includes the host layers 113a comprising the second metal oxide having a degree of oxygen deficiency smaller than that of the first metal oxide and including the inserted layer 113b provided between each of the adjacent pairs of the host layers 113a, and forming the second electrode layer 104 above the second variable resistance layer 103b, and (ii) a method for manufacturing a nonvolatile memory element which includes forming the second electrode layer 104 above the substrate 101, forming, above the second electrode layer 104, the second variable resistance layer 103b which includes the second metal oxide and the inserted layer 113b provided between each of the adjacent pair of the host layers 113a, forming, above the second variable resistance layer 103b, the first variable resistance layer 103a comprising the first metal oxide having a degree of oxygen deficiency larger than that of the second metal oxide, and forming the first electrode layer 102 above the first variable resistance layer 103a.

Moreover, the present disclosure includes a method for manufacturing a nonvolatile memory element which includes forming the non-ohmic element 209 which includes the first conductive layer 205 in contact with the second electrode layer 104, the second electrode layer 207, and the semiconductor layer or the insulating layer 206 provided between the first conductive layer 205 and the second conductive layer 207, even when any of the second electrode layer 104 and the non-ohmic element 209 is arranged at a side near the substrate 101.

Moreover, it is considered that the nonvolatile memory element includes a modification in which the third variable resistance layer is provided.

Figure 19:
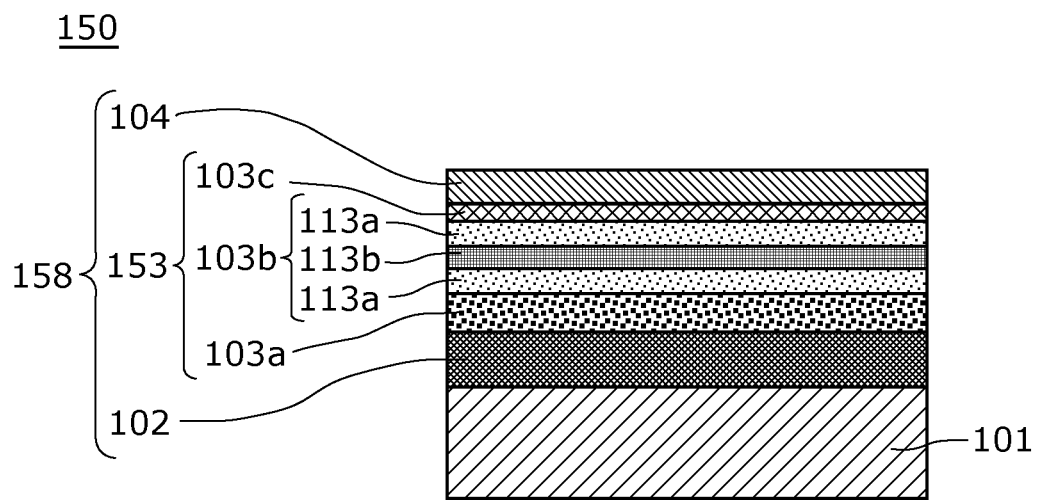
FIG. 19 is a cross-sectional view showing a configuration of a nonvolatile memory element according to Modification.

FIG. 19 is a cross-sectional view showing an example of a configuration of a variable resistance nonvolatile memory element 150 according to Modification. In the nonvolatile memory element 150, compared with the nonvolatile memory element 100 according to Embodiment 1, the third variable resistance layer 103c which is in contact with the second variable resistance layer 103b and comprises the third metal oxide having a stoichiometric composition is added to the variable resistance layer 103. Here, although the stoichiometric composition is not categorically a stoichiometric composition, a composition effectively equal to the stoichiometric composition is included. The third metal oxide may be tantalum oxide $Ta_2O_5$ having a stoichiometric composition.

Moreover, the third metal oxide may be $Ta_2O_{4.99}$ and $Ta_2O_{5.01}$, and these are examples of the case where they are effectively equal to the stoichiometric composition. When the nonvolatile memory elements 150 are sequentially manufactured, there is little progress in oxidation of the third metal oxide having a stoichiometric composition and it is considered that stable composition can be maintained. Therefore, the effect of stabilizing variable resistance characteristics of the nonvolatile memory elements 150 is not prevented by the third variable resistance layer 103c.

Figure 20:
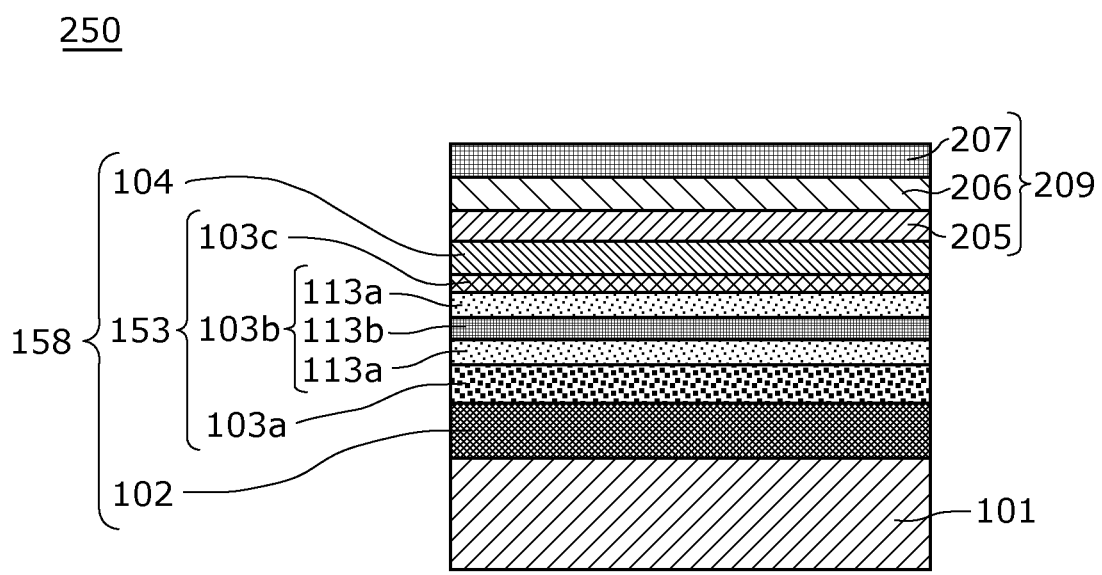
FIG. 20 is a cross-sectional view showing a configuration of a nonvolatile memory element according to Modification.

FIG. 20 is a cross-sectional view showing an example of a configuration of a variable resistance nonvolatile memory element 250 according to Modification. In the nonvolatile memory element 250, compared with the nonvolatile memory element 200 according to Embodiment 2, the third variable resistance layer 103c in contact with the second variable resistance layer 103b comprises the third metal oxide having a stoichiometric composition in the same sense as that described above is added to the variable resistance layer 103.

Therefore, as similarly to the above described nonvolatile memory element 150, when the nonvolatile memory elements 250 are sequentially and successively manufactured, the effect of stabilizing variable resistance characteristics of the nonvolatile memory elements 250 is not prevented by the third variable resistance layer 103c.

In the nonvolatile memory elements 150 and 250, the arrangements of the first variable resistance layer 103a and the second variable resistance layer 103b may be reversed.

Figure 21:
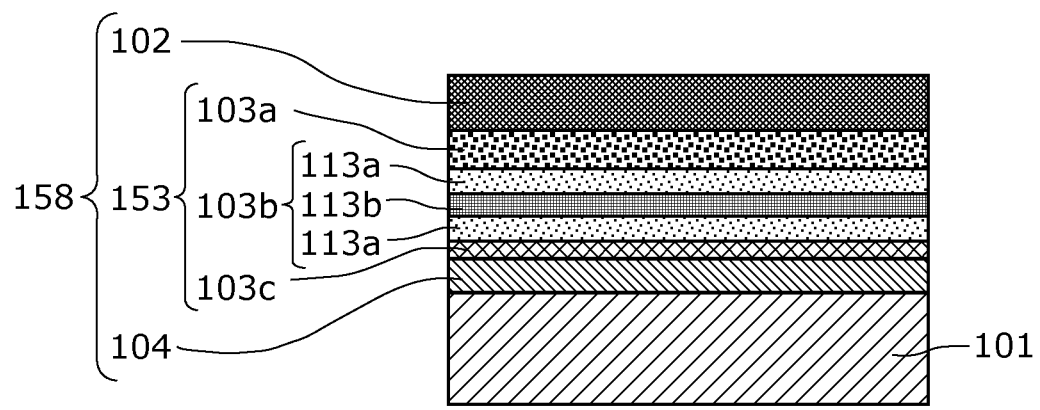
FIG. 21 is a cross-sectional view showing a configuration of a nonvolatile memory element according to Modification.

FIG. 21 is a cross-sectional view showing an example of a configuration of a variable resistance nonvolatile memory element 350 according to Modification. In the nonvolatile memory element 350 shown in FIG. 21, each of the layers comprised in the variable resistance element 108 is stacked above the substrate 101 in an order opposite to that of the nonvolatile memory element 150.

Figure 22:
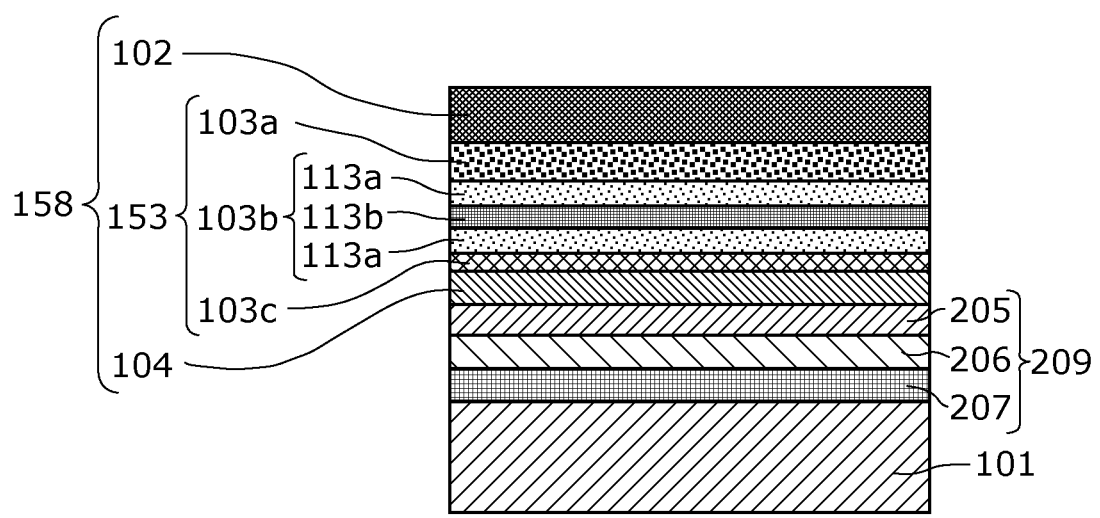
FIG. 22 is a cross-sectional view showing a configuration of a nonvolatile memory element according to Modification.

FIG. 22 is a cross-sectional view showing an example of a configuration of a variable resistance nonvolatile memory element 450 according to Modification. In the nonvolatile memory element 400 shown in FIG. 18, each of the layers comprised in the variable resistance element 108 and the non-ohmic element 209 is stacked in an order opposite to that of the nonvolatile memory element 250.

As described above, in the nonvolatile memory elements 350 and 450, by providing the inserted layer, a degree of oxygen deficiency of the host layer can be easily maintained at an intended degree. As a result, the effect of stabilizing variable resistance characteristics of the nonvolatile memory elements is delivered.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

A nonvolatile memory element according to the present disclosure can, by providing at least one inserted layer to the second variable resistance layer under a condition of oxygen gas flow rate smaller than that of the host layer, reduce progress in oxidation on the metal target surface even when the variable resistance layers each comprising a metal oxide having a high resistivity are successively formed. As a result, the present disclosure is useful in various electronic devices using the nonvolatile memory device because electrical characteristics of the variable resistance layer in mass production are stable.

The invention claimed is:

1. A method for manufacturing a nonvolatile memory element, the method comprising:

forming a first electrode layer above a substrate;

forming, above the first electrode layer, a first variable resistance layer comprising an oxygen-deficient first metal oxide;

forming, above the first variable resistance layer, a second variable resistance layer which comprises a second metal oxide, and includes a plurality of host layers and an inserted layer provided between each of adjacent pairs of the host layers, the second metal oxide having a degree of oxygen deficiency smaller than a degree of oxygen deficiency of the first metal oxide; and forming a second electrode layer on the second variable resistance layer, wherein in the forming of a second variable resistance layer, the host layer is formed above the first variable resistance layer, the host layer comprising the second metal oxide having a degree of oxygen deficiency smaller than the degree of oxygen deficiency of the first metal oxide, the inserted layer is formed above the host layer, the inserted layer comprising the second metal oxide having a degree of oxygen deficiency larger than a degree of oxygen deficiency of the host layer, and another host layer is formed above the inserted layer, after the host layer and the inserted layer are formed at least once in this order, the another host layer comprising the second metal oxide having a degree of oxygen deficiency smaller than a degree of oxygen deficiency of the inserted layer.

2. The method for manufacturing a nonvolatile memory element according to claim 1, further comprising:

forming, above the second resistance layer, a third variable resistance layer comprising a third metal oxide having a stoichiometric composition; and forming the second electrode layer above the third variable resistance layer.

3. The method for manufacturing a nonvolatile memory element according to claim 1, wherein in the forming of a host layer, reactive sputtering using a metal target is performed in an atmosphere having a flow rate of oxygen gas that is a first rate, and in the forming of an inserted layer, reactive sputtering using the metal target is performed in an atmosphere having a flow rate of oxygen gas that is a second rate smaller than the first rate.

4. The method for manufacturing a nonvolatile memory element according to claim 1, wherein in the forming of a second variable resistance layer, the second variable resistance layer is formed above the substrate consecutively after a variable resistance layer is formed above a dummy substrate different from the substrate prior to the formation of the second variable resistance layer above the substrate.

5. The method for manufacturing a nonvolatile memory element according to claim 1, further comprising forming a non-ohmic element which includes a first conductive layer in contact with the second electrode layer, a second conductive layer, and a semiconductor layer or an insulating layer which is provided between the first conductive layer and the second conductive layer.

* * * * *